United States Patent
Helmersson et al.

(10) Patent No.: US 11,351,602 B2
(45) Date of Patent: Jun. 7, 2022

(54) NANOWIRES AND PROCESS FOR THEIR PRODUCTION

(71) Applicants: Ulf Helmersson, Brokind (SE); Nils Brenning, Johanneshov (SE); Sebastian Ekeroth, Linköping (SE)

(72) Inventors: Ulf Helmersson, Brokind (SE); Nils Brenning, Johanneshov (SE); Sebastian Ekeroth, Linköping (SE)

(73) Assignee: IONAUTICS AB

( * ) Notice: Subject to any disclaimer, the term of this patent is extended or adjusted under 35 U.S.C. 154(b) by 63 days.

(21) Appl. No.: 16/467,551

(22) PCT Filed: Dec. 8, 2017

(86) PCT No.: PCT/SE2017/051236
§ 371 (c)(1),
(2) Date: Jun. 7, 2019

(87) PCT Pub. No.: WO2018/111176
PCT Pub. Date: Jun. 21, 2018

(65) Prior Publication Data
US 2019/0308239 A1    Oct. 10, 2019

(30) Foreign Application Priority Data
Dec. 12, 2016  (SE) .................................. 1651630-4

(51) Int. Cl.
*B22F 1/054* (2022.01)
*B22F 5/12* (2006.01)
(Continued)

(52) U.S. Cl.
CPC .............. *B22F 1/0547* (2022.01); *B22F 5/12* (2013.01); *B22F 9/12* (2013.01); *C23C 14/165* (2013.01);
(Continued)

(58) Field of Classification Search
CPC .. B22F 1/0025; B22F 5/12; B22F 9/12; B22F 2201/10; B22F 2201/11; B22F 2202/13;
(Continued)

(56) References Cited

U.S. PATENT DOCUMENTS

2006/0258132 A1* 11/2006 Brown .............. H01L 29/66439
438/610
2010/0133462 A1   6/2010 Lin et al.
(Continued)

FOREIGN PATENT DOCUMENTS

| CN | 103031593 A | 4/2013 |
| CN | 103276360 A | 9/2013 |

(Continued)

OTHER PUBLICATIONS

Zhao et al. ("Formation Mechanism of Fe Nanocubes by Magnetron Sputtering Inert gas condensation." ACSNano. Published Mar. 10, 2016.) (Year: 2016).*

(Continued)

*Primary Examiner* — Anthony J Zimmer
*Assistant Examiner* — Ricardo D Morales
(74) *Attorney, Agent, or Firm* — McDonald Hopkins LLC

(57) ABSTRACT

A process for producing magnetic nanowires of high quality and a good production yield is disclosed. The process comprises sputtering a target of a magnetic material using a plasma, growing nanoparticles from the sputtered matter to magnetic nanoparticles and collecting the magnetic nanoparticles on a substrate in the form of nanowires.

19 Claims, 6 Drawing Sheets

(51) Int. Cl.
*B22F 9/12* (2006.01)
*C23C 14/34* (2006.01)
*C23C 14/35* (2006.01)
*H01F 1/00* (2006.01)
*C23C 14/16* (2006.01)

(52) U.S. Cl.
CPC ........ *C23C 14/345* (2013.01); *C23C 14/3485* (2013.01); *C23C 14/351* (2013.01); *H01F 1/0072* (2013.01); *B22F 2201/10* (2013.01); *B22F 2201/11* (2013.01); *B22F 2202/13* (2013.01)

(58) Field of Classification Search
CPC . C23C 14/165; C23C 14/345; C23C 14/3485; C23C 14/351; H01F 1/0072
See application file for complete search history.

(56) References Cited

U.S. PATENT DOCUMENTS

2014/0248339 A1  9/2014  Karathanasis et al.
2017/0154701 A1  6/2017  Lee et al.

FOREIGN PATENT DOCUMENTS

| EP | 2684838 A2 | | 1/2014 |
|---|---|---|---|
| FR | 2932013 A1 | | 12/2009 |
| KR | 20010114201 A | * | 12/2001 |
| WO | 2011105957 A1 | | 9/2011 |

OTHER PUBLICATIONS

Binns ("Introduction to Nanoscience and Technology", p. 3, Wiley) (Year: 2010).*
Helmersson et al. ("Ionized physical vapor deposition (IPVD): A review of technology and applications." Thin solid films 513.1-2 (2006): 1-24.) (Year: 2006).*
Gao et al. ("Influence of an External Magnetic Field on the Growth of Nanocrystalline Silicon Films Grown by MF Magnetron Sputtering." Journal of Materials Science & Technology 28.11 (2012): 992-998.) (Year: 2012).*
Jang et al. ("Large-scale nanopatterning of metal surfaces by target-ion induced plasma sputtering (TIPS)." RSC advances 6.28 (2016): 23702-23708.) (Year: 2016).*
KR-20010114201—A english translation (Year: 2001).*
Zhao et al, "Formation Mechanism of Fe Nanocubes by Magnetron Sputtering Inert Gas Condensation", ACS NANO,vol. 10, No. 4, Mar. 10, 2016 (Mar. 10, 2016), p. 4684-4694.
Athanassiou et al, "Template free, large scale synthesis of cobalt nanowires using magnetic fields for alignment; Template free, large scale synthesis of cobalt nanowires using magnetic fields for alignment", Nanotechnology, IOP, Bristol, GB,vol. 18, No. 16, Apr. 25, 2007 (Apr. 25, 2007), p. 165606.
International Search Report and Written Opinion dated Feb. 27, 2018; International Patent Application No. PCT/SE2017/051236 filed Dec. 8, 2017.
Pilch et al, "Fast growth of nanoparticles in a hollow cathode plasma through orbit motion limited ion collection", Applied Physics Letters, vol. 103, 193108 (2013).
Swedish Office Action dated Jun. 8, 2017, Application No. 1651630-4.
Nedyalkov et al, "Magnetic nanoparticle complosed nanowires fabricated by ultrashort laser ablation in air", Pplied Physics Letters, vol. 108, 043107 (2016).
Purohit et al, "ECR plasma assisted deposition of zinc nanowires", Nuclear Instruments and Methods in Physics Research B, vol. 266, pp. 4980-4986 (2008).
Sharma, "Mulit-segmented magnetic nanowires as multifunctional theranostic tools in nanomedicine", Dissertation submitted to the Faculty of University of Minnesota; Jul. 2015.
Gatel et al, "Size-Specific Spin Configurations in Single Iron Nanomagnet: From Flower to Exotic Vortices", Nano Letters, vol. 15, pp. 6952-6957(2015).
Chen, "Lecture Noes on Langmuir Probe Diagnostics", Electrical Engineering Department University of California, Mini-course on Plasma Diagnostics, IEEE-ICOPS metting, Jeju, Korea, Jun. 5, 2003.
Hu et al, "Synthesis and assembly of nanomaterials under magnetic fields", The Royal Society of Chemistry, Nanoscale, vol. 6, pp. 14064-14105 (2014).
Swedish Office Action dated May 8, 2018, Application No. 1751239-3.
Li et al, "Self-assembly mechanism of Ni nanowires prepared with an external magnetic field", Beilstein Journal of Nanotechnology, vol. 6, pp. 2123-2128 (2015).
Ivanov et al, "Modulated Magnetic Nanowires for Controlling Domain Wall Motion: Toward 3D Magnetic Memories", vol. 10, pp. 5326-5332 (2016).
Helmersson et al., "Ionized physical vapor deposition (IPVD): A review of technology and applications." Thin Solid Films, 513, (2006), pp. 1-24.
Samuelsson et al., "Influence of ionization degree on film properties when using HiPIMS." American Vacuum Society, 30(3), (2012), pp. 031507-1-5.

* cited by examiner

NANOWIRES AND PROCESS FOR THEIR PRODUCTION

CROSS-REFERENCE TO RELATED APPLICATION

This application is a 35 U.S.C. § 371 national stage application of PCT Application No. PCT/SE2017/051236 filed on Dec. 8, 2017, entitled "NANOWIRES AND PROCESS FOR THEIR PRODUCTION," which claims priority to Swedish Patent Application No. 1651630-4 filed on Dec. 12, 2016, each of which are incorporated herein in their entirety by reference.

TECHNICAL FIELD

The present disclosure relates in general to the technical field of nanowires of magnetic materials and a process for the production thereof.

BACKGROUND

Nanowires, sometimes also called nanochains, are elongated structures with a diameter in the order of nanometres. Nanowires often have a ratio between the length and the width of more than 100, in some cases more than 1000. For said reason, nanowires are sometimes referred to as one-dimensional (1D) materials. Nanowires can be formed of a plurality of materials ranging from metals or compounds. The diameter of nanowires depends inter alia on the material of the nanowires and on the method for its production. Also the possible length of the nanowires depends on the method for its production.

Nanowires of magnetic materials possess unique properties for example in terms of the magnetic properties in comparison with those of a corresponding bulk phase. It is therefore expected that magnetic nanowires can be used in various applications, including magnetic storage devices, microwave absorbing materials, gas sensors, spintronic devices, energy storage devices, catalysts and biomedical applications. For example, nanowires of iron have a high magnetic moment, and due to their single domain structure, they exhibit relatively high coercivity and remanence magnetisations values.

In view of the above, production of nanowires of magnetic materials has attained a lot of research in recent years. Hydrothermal reduction, thermal decomposition of metal vapours, and laser ablation are productions methods which have been proposed. Furthermore, the use of magnetic fields for obtaining a desired orientation of the nanowires has been proposed for the above mentioned production processes. Most of the methods used include the use of a template, for example made of porous anodic aluminium oxide, but there are also template-free methods. Template methods suffer from the drawback that the template has to be removed and often also that large amounts of material cannot be produced.

Helin Niu et al. *Magnetic field-induced growth and self-assembly of cobalt nanocrystallites*, J. mater. Chem., 2003, 13, 1803-1805, discloses a study of growth and assembly behaviour of cobalt magnetic nanocrystallites under an external magnetic field. A solvothermal reduction method was used to prepare Co nanoparticles, and wires with an average length of 2 mm and diameter of 13 µm were formed by the self-assembly of Co nanocrystallites under a magnetic field. Moreover, Zhaoxia Kou et al., *The magnetic properties of well-aligned nickel nanowires synthesized by magnetic field-induced assembly approach*, Journal of Applied Physics 117, 17E709, 2015, discloses formation of uniform one-dimensional Ni chains with controllable diameters and lengths synthesised by a hydrothermal process wherein nickel chloride was used as starting material. Hydrothermal reduction processes inter alia suffer from the drawback of resulting in unwanted oxide formation in the nanowires. The oxide tends to form as a shell around the metallic nanoparticles before the nanoparticles attach to each other to form nanowires.

G. H. Lee et al., *Processing of ferromagnetic iron nanowire arrays*, Scripta Materialia 49 (2003) 1151-1155, report fabrication of ferromagnetic iron nanowires by thermally decomposing iron pentacarbonyl ($Fe(CO)_5$) molecules under a magnetic field resulting in linearly aligned nanowires. Moreover, Yang et al., *Large scale growth and magnetic properties of Fe and $Fe_3O_4$ nanowires*, Journal of Applied Physics 99, 08Q507, 2006, also reports synthesis of Fe nanowires by thermal decomposition of iron pentacarbonyl. Arrays of Fe nanowires, with a diameter from 20 nm to 1 µm and lengths up to several centimetres, were obtained using different deposition times and temperatures. It was further reported that annealing in air of the Fe nanowires lead to the formation of $Fe_2O_3/Fe_3O_4$ wires, which after heat treatment in a $N_2$/alcohol atmosphere form $Fe_3O_4$ wires. Thermal decomposition of pentacarbonyl molecules in order to obtain metallic nanowires suffers from the drawback of a risk of unwanted oxide formation between the nanoparticles in the nanowires. Yang et al. argued that the amount of oxide in the Fe nanowires is likely due to CO gas resulting from the decomposition of $Fe(CO)_5$.

Seung H. Huh et al., *Fabrication of ferromagnetic nanocluster rods by magnetic trapping*, Journal of Applied Physics, Volume 95, Number 5, 1 Mar. 2004, reported production of ferromagnetic nanometres scale cluster rods of $Fe_{67.6}Nd_{26.3}Dy_{3.2}B_{2.3}$ and Co, respectively, using pulsed-laser ablation combined with magnetic-field trapping. One-dimensional structured soft magnets, up to about 150 nm in length and consisting of magnetic clusters a few nanometres in scale, were obtained. The pulsed-laser ablation resulted in nanoclusters in the range of 3-6 nm for Fe—Nd—Dy—B and 1-4 nm for Co. The nanoclusters obtained where transported into the magnetic zone by the flowing gas, and in the magnetic zone acted as building blocks forming a linear assembly under the magnetic field. The process used in Seung H. Huh et al. is however relatively slow, in the order of hours for obtaining a sufficient length, and is therefore not suitable for large scale production. The process and apparatus used by Seung H. Huh et al. also limits the length of the rods since the flowing gas may induce movement of the rods and then cause the nanowires to break. Furthermore, in the rods, the nanoclusters are not aligned along the longitudinal axis of the rods, but somewhat randomly distributed along the longitudinal extension of the rods.

Nedyalkov et al., *Magnetic nanoparticle composed nanowires fabricated by ultrashort laser ablation in air*, Applied Physics Letters 108, 043107, 2016, also report formation of nanoparticle composed wires of magnetic material. Ultrashort laser ablation in air at atmospheric pressure in the presence of external magnetic field was used. Nedyalkov et al. reported that the nanoparticles obtained a core-shell structure. In the case of Ni, the core-shell structure caused lowered magnetization due to the presence of large oxide. Better results were however obtained in the case of using a stainless steel target. However, Nedyalkov et al also reported that there will be a formation of nanowires already in the gas phase. This may be disadvantageous for example if the nanowire needs to be electrically connected to a substrate for an application.

SUMMARY

The object of the present disclosure is a process for producing magnetic nanowires of high quality with a good production yield.

In particular, a high quality of the nanowires themselves is achieved in case there is an interface between individual nanoparticles in the nanowire which is essentially free from impurities or unwanted compounds. For example in the case of metallic magnetic nanowires that there is a minimal amount of, preferably no, oxide between the metallic nanoparticles forming the nanowire. A shell on a nanoparticle before it is attached to another nanoparticle to form a nanowire should therefore preferably be avoided.

A good production yield is considered to be production yield which would be suitable for industrial production, i.e. the process needs to be able to scaled-up from a lab scale to an industrial scale within an associated reasonable costs and without risk of loss of quality.

Furthermore, it is preferred that the process for production of magnetic nanowires can be easily controlled for example in terms of the diameter of the resulting magnetic nanowires and in terms of enabling branched or non-branched nanowires.

The process for production of magnetic nanowires according to the present invention comprises sputtering atoms from a first electrically conducting target made of a first magnetic material, wherein sputtering is performed in a controlled atmosphere using a plasma. The process further comprises ionising at least a portion of the sputtered target atoms in said plasma and thereafter using the sputtered target atoms, of which at least a portion thereof are ionised, to grow magnetic nanoparticles comprising the sputtered target atoms. The growth of the magnetic nanoparticles is conducted at a distance from a substrate on which the magnetic nanoparticles are to be collected. The process further comprises, collecting the magnetic nanoparticles on the substrate in the form of a plurality of nanowires. The collection is performed in the controlled atmosphere.

The purpose of allowing the sputtered target atoms to be ionised by the plasma is to increase the probability of the sputtered target atoms to collide with a previously formed particle or particle nucleus inside the plasma and therefore enables a higher possibility for growing nanoparticles, and thereby a higher nanoparticle-production efficiency. This higher probability of collision of a sputtered target atom with a previously formed nanoparticle or a nanoparticle nucleus is a consequence of the negative charge a nanoparticle acquires in a plasma, which for typical plasma conditions (specifically, an electron temperature $T_e$ of a few eV) increases the collection probability of ions of sputtered target atoms with typically two orders of magnitude as compared to the collection of neutrals.

While the sputtered target atoms as such may be magnetic, the magnetism of a nanoparticle increases drastically with the size of the nanoparticle. It is therefore important to grow magnetic nanoparticles in accordance with the present process as opposed to collecting sputtered target atoms (or sputtered agglomerates or the like) directly on a substrate as the latter will not lead to formation of nanowires.

Although the magnetism of the nanoparticles is used in the formation of the nanowires on the substrate, as will be described below, it is desirable to avoid agglomeration of nanoparticles through the magnetic attraction between the nanoparticles in the gas phase. Avoiding agglomeration of nanoparticles before the collection thereof increases the possibility to control the structures both of individual nanowires, and of arrays of nanowires, that grow on the substrate since it enables said structures to be built up of individual arriving nanoparticles, as opposed to the case where the arriving nanoparticles have already started to agglomerate to wires, rods or agglomerates of varying geometric configurations. In this respect it is favourable that the nanoparticles will be negatively charged inside the plasma. The negative charge on nanoparticles in typical plasma is high enough to give a repulsive potential barrier which prevents the nanoparticles from forming agglomerates which would otherwise occur as a result of the magnetic properties of the nanoparticles.

When collecting the nanoparticles on the substrate, nanoparticles already present on the substrate will act as a magnet and thereby attract the magnetic nanoparticles in the vicinity thereof to the substrate and individual free-standing nanowires will form on the substrate. A condition for this to happen is that, in contrast to in the plasma, the nanoparticles already present on the substrate will not be negatively charged and thus not counteract the magnetic force between the nanoparticles on the substrate and the magnetic nanoparticle not yet collected. The formation and growth of the nanowires therefore occurs by addition of the magnetic nanoparticles onto the longitudinal ends of nanowires already present on the substrate or on nuclei to such nanowires on the substrate. In other words, the nanowires will be grown on the substrate by a pile-up of magnetic nanoparticles from the gas phase at the longitudinal end of the nanowires or nuclei already present on the substrate.

In view of the above, the present process provides an effective process for production of nanowires of magnetic material. Furthermore, the fact that the sputtering and collection are performed under a controlled atmosphere ensures that the contacts between the nanoparticles in the nanowires are free from impurities and/or compounds, which is further described in the detailed description, and therefore that the nanowires have a high bonding strength between the individual nanoparticles. Furthermore, the nanowires have a high electrical conductivity in comparison to nanowires produced from the same magnetic material but through previously known processes. For the same reason, the nanowires will have a good electrical contact to the substrate on which the nanowires are deposited. Moreover, it is likely that the nanowires also will have a higher tensile strength compared to for example a case where an oxide between nanoparticles has been removed by a reduction step, which in turn could cause a risk of nanoparticles loosing contact between each other.

The growth of the magnetic nanoparticles from sputtered target atoms is preferably performed inside the plasma. This ensures a fast and efficient growth process, as well as ensures that the nanoparticles are not agglomerated before being collected on the substrate.

The first magnetic material may suitably be a first magnetic metal or an alloy comprising said first magnetic material. Thereby, it is possible to produce metallic magnetic nanowires. The metallic magnetic nanowires can be obtained with a minimal risk for presence of oxide between the individual nanoparticles of the nanowire, which may be an issue with previously known techniques. Such nanowires exhibit inter alia a superior electrical conductivity as well as a bonding strength between the individual nanoparticles.

The controlled atmosphere may suitably be an inert atmosphere, preferably an inert argon atmosphere. Such an atmosphere may however also comprise a controlled small amount of impurities, including reactive elements, for the purpose of initiating nucleation of the nanoparticles. Therefore, the inert atmosphere may more correctly be described as an essentially inert atmosphere. It shall however be understood that the term "inert atmosphere" is not intended to encompass introduction of a reactive gas intended to react with the sputtered target atoms to thereby form magnetic compound materials.

The magnetic nanoparticles may suitably be collected on the substrate with the use of an applied magnetic field. This can easily be achieved by providing a permanent magnet on or close to a surface of the substrate opposite the surface on which the nanoparticles are to be collected. The use of a magnetic field will result in an effective entrapment of the magnetic nanoparticles and a magnetic force drawing the particles towards the substrate, which results in a much higher growth rate of the nanowires. Furthermore, the resulting nanowires will inherently be aligned with the magnetic field, thereby creating a high degree of alignment between the different resulting nanowires on the substrate.

Alternatively, the magnetic nanoparticles may be collected without the use of an applied magnetic field. It has been found that such a collection result in a random orientation of the nanowires in relation to each other, resulting in a tangle. Still, the nanowires are not connected to each other but merely twisted in relation to each other, and can be separated from each other to individual nanowires, and can therefore be described as free-standing nanowires when in the tangle.

The process according to the invention may suitably comprise ionising at least 20% of the sputtered target atoms, preferably at least 40% of the sputtered target atoms, and most preferably at least 60% of the target atoms. An increase in the amount of ionised sputtered target atoms inter alia results in an increase in the growth rate of the nanoparticles and thus an increase in the productivity of the process.

The substrate is suitably located inside the plasma or at least in a volume wherein the electron temperature $T_e$ is equal to or higher than 0.1 eV, preferably equal to or higher than 0.2 eV, even more preferably equal to or higher than 0.3 eV. This increases the growth rate of the nanowires considerably and thus leads to a much more efficient process. The location of the substrate on which the nanoparticles are collected ensures that the nanoparticles remain negatively charged, and thereby repel each other and remain suspended in the plasma/gas, before they are collected. Furthermore, in the case of production of metallic nanowires in an inert atmosphere, this ensures that the nanoparticles cannot be oxidised before being collected in the nanowire and therefore ensures a metallic contact between the nanoparticles in the nanowire.

The substrate on which the nanoparticles are collected so as to form nanowires is preferably electrically conducting, at least at the surface thereof adapted for collection of the nanoparticles. This facilitates the production since the magnetic nanowires on the substrate can more easily lose their negative charge. If the nanowires on the substrate are negatively charge, there will be a repelling force to the magnetic nanoparticles which are negatively charged before they are collected. This repelling force, to a certain extent, counteracts the magnetic force seeking to attract the magnetic nanoparticles to the magnetic nanowires. This can be avoided by using an electrically conducting substrate.

Moreover, the substrate is preferably provided with an electrical bias. This may for example further increase the production rate for the same reasons as described above with regard to an electrically conducting substrate.

In accordance with a preferred aspect of the present invention, the plasma is generated by a pulsed electric power supply. This inter alia increases the possibility of ionising sputtered target atoms and thus leads to a higher productivity. The pulsed electric power supply may suitably be applied with a frequency of at least 100 Hz, and with a duration of the pulses of at least 5 microseconds. Furthermore, the pulsed electric power supply may suitably be obtained with a current density of more than 0.1 A/cm$^2$, preferably a current density of more than 0.5 A/cm$^2$, as calculated over the whole target surface.

The process according to the present invention may also comprise sputtering atoms from a second electrically conducting magnetic target made of a second magnetic material. Thereby, it is possible to obtain tailored nanowires, for example comprising different (for example alternating) magnetic materials along the longitudinal extension of the nanowire. This can be very difficult to achieve by the prior art processes and therefore provides a whole range of new alternative nanowires.

In order to attain sufficient magnetisation, the nanoparticles may suitably be grown to an average size of at least 10 nm.

According to one aspect of the present invention, the magnetic nanoparticles are ferromagnetic or superparamagnetic with a magnetically single domain. This further enables them to self-assemble to form nanowires. Multi-domains can reduce the magnetic field penetrating out from the nanoparticle, and may thus reduce the effect of the magnetic field for the assembly of nanoparticles to a nanowire.

By the process according to the present invention, new types of magnetic nanowires are obtainable.

One example thereof is a magnetic nanowire composed of a plurality of metallic magnetic nanoparticles wherein the interface between the metallic magnetic nanoparticles in the nanowire is essentially free from oxide. Thereby, a metallic contact between the magnetic nanoparticles of the nanowire is obtained.

Another example is a tangle of randomly oriented individual magnetic nanowires, each magnetic nanowire composed of a first metal or a first compound, and wherein the tangle has a density of less than 5%, preferably less than 1%, of a bulk density of the material of which the magnetic nanowires are composed.

Yet another example is a metallic magnetic nanowire comprising a plurality of metallic magnetic nanoparticles, wherein the metallic magnetic nanoparticles are arranged in the magnetic nanowire such that their respective centres coincide with a longitudinal axis of the magnetic nanowire.

Yet another example is a magnetic nanowire comprising a plurality of magnetic nanoparticles, and wherein a first longitudinal portion of the magnetic nanowire is composed of magnetic nanoparticles of a first magnetic material and wherein a second longitudinal portion of the magnetic nanowire is composed of magnetic nanoparticles of a second magnetic material, preferably wherein the magnetic nanowire comprises a plurality of said first longitudinal portion and a plurality of said second longitudinal portion, the first longitudinal portions alternating with the second longitudinal portions along the longitudinal extension of the magnetic nanowire.

The nanowires and the tangle, respectively, described above and obtainable by the present process may suitably be used in a magnetic storage device, as microwave absorbing material, in a gas sensor, in a spintronic device, in an energy storage device, as electrode material for electrocatalysis, such as water splitting, as electrode material for battery applications, as a catalysts or in a biomedical application.

DEFINITIONS

Figure 1:
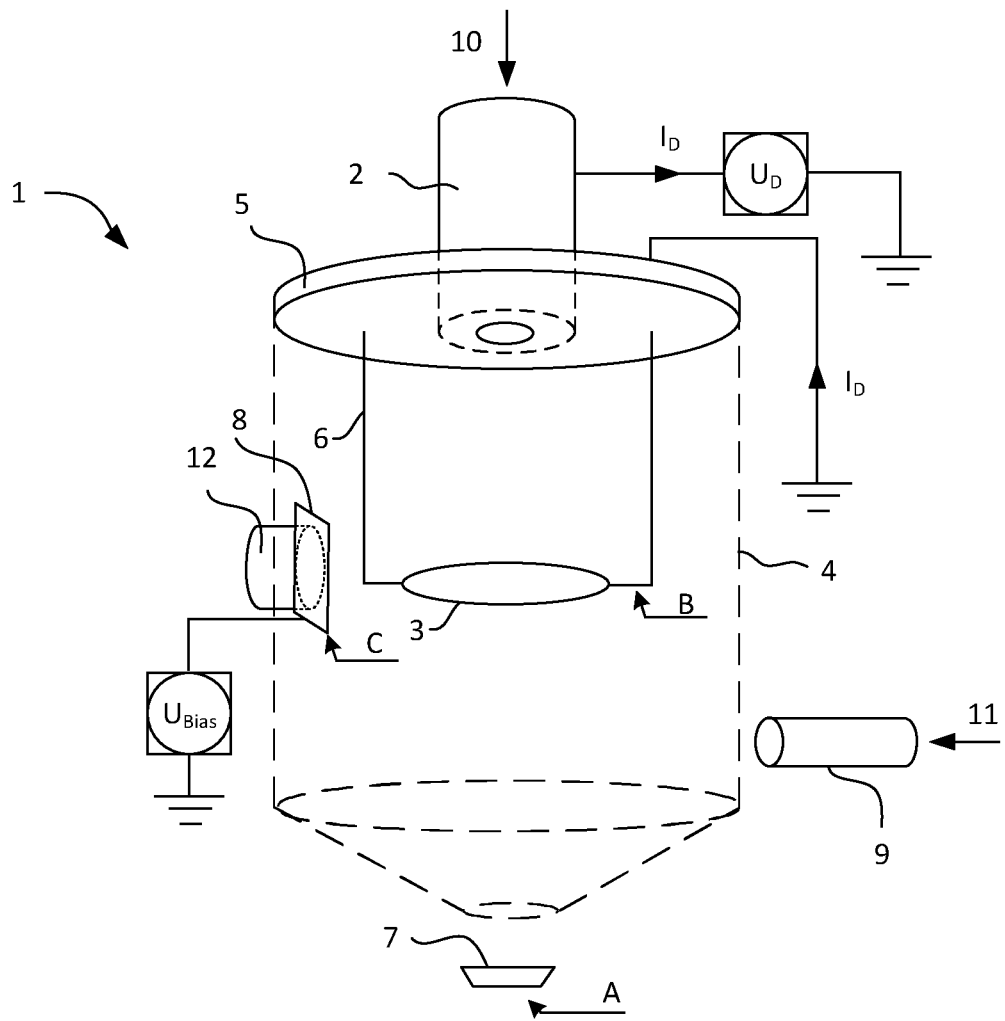
FIG. 1 schematically illustrates a sputtering apparatus in which the process according to the present invention can be performed FIG. 2 schematically illustrates the magnetic capture of magnetised nanoparticles to a substrate.

For the purpose of the present disclosure, the following definitions should be considered unless explicitly given otherwise.

In the present disclosure, a nanowire shall be considered to mean an elongated structure with a diameter in the order of nanometres, i.e. between 1 nm and 999 nm, and a ratio between the length and the diameter of the elongated structure of more than about 10 (usually equal to or more than 50, and preferably a ratio of equal to or more than 100). A diameter in this regard should be considered a diameter perpendicular to the longitudinal extension of the nanowire at one specific point, wherein said point does not coincide with a branching point in the case of a branched nanowire. Thus, when considering branched nanowires, the diameter of the nanowire is not determined by the branch but of the diameter of consecutive nanoparticles of the nanowire.

Furthermore, in the present disclosure, there is a distinction between an inherent magnetic field and an applied magnetic field. An applied magnetic field is a magnetic field which has been purposively applied by the use of a separate magnet. The term "applied magnetic field" and similar expressions do therefore not encompass the magnetic field of a nanoparticle or of the resulting nanowires. Furthermore, when collection is referred to as being performed with a magnet, this shall be considered to correspond to an applied magnetic field.

The term "magnetic nanoparticle" is used herein to cover all ferromagnetic and superparamagnetic nanoparticles, unless specifically disclosed otherwise. The relation between the terms ferromagnetic and superparamagentic is described by Bishop et al., *Nanoscale Forces and Their Uses in Self-Assembly*, Small 14, 1600-30, 2009. Magnetic bodies that are smaller than the characteristic domain size of the material, and at a temperature below the Curie temperature, transition to a single-domain ferromagnet that is characterized by a preferential axis of orientation of the magnetization in the nanoparticle. Large deviations (more than 90) of the magnetization from this direction require crossing an energy barrier with a height that depends on the size of the nanoparticle. This effect distinguishes between two distinct size regimes—the ferromagnetic and the superparamagnetic. In ferromagnetic particles, the magnetization is "locked" to the material of the particle while for small enough particles, in superparamagnetism, it can rotate freely. If there is no external magnetic field, a superparamagnetic particle therefore exhibits a time-average zero magnetization. In the presence of an external magnetic field, however, also superparamagnetic particles can have their magnetization locked, in this case to align with the direction of the external field.

DETAILED DESCRIPTION

The invention will be further described below in detail with reference to certain embodiments and the drawings as well as experimental results. The invention is however not limited to the specific embodiments or experimental results discussed but may be varied within the scope of the appended claims. Moreover, the drawings shall not be considered to necessarily be drawn to scale as some features may be exaggerated in order to more clearly illustrate features therein.

In accordance with the present invention, a process for production of magnetic nanowires with high productivity and resulting in nanowires with high quality has been obtained. The process utilises plasma sputtering to obtain nanoparticles of a sufficient size and/or size distribution. The nanoparticles are then collected in the form of nanowires on a substrate.

The nanowires obtained through the present process are free-standing in the sense that they are not arranged in or supported by a separate solid matrix (i.e., something else than the nanowires themselves) arranged between the nanowires. In other words, there is no solid material of another composition than the nanowires themselves located between two adjacent nanowires. However, the nanowires may each be attached to a solid substrate.

There are previously known methods for producing nanoparticles in general by sputtering. One particular example is the plasma sputtering process. Sputtering is the physical ejection of atoms from a cathode surface. In the process, ions of a sputter gas (often argon), are generated in the plasma and drawn out of the plasma and accelerated across a cathode sheath. The cathode has a lower potential than the region in which the plasma is formed and the cathode surface therefore attracts positive ions. The positive ions move towards the target with a high velocity and then impact the target thereby causing atoms from the target to physically dislodge or sputter from the cathode surface. The cathode is often referred to as the "target".

Plasma sputtering has the advantage that nanoparticles are formed from material of a solid cathode. A solid cathode is especially suitable in case of production of particles comprising metallic materials since it eliminated the need for metal species containing gases which often are toxic and require complex manufacturing methods. Furthermore, it avoids the need for metal species containing gases which comprises oxygen, such as $Fe(CO)_5$ used in the thermal decomposition method previously known for producing nanowires. Therefore, plasma sputtering is especially suitable when seeking to produce metallic nanoparticles which should be essentially free from surface oxides.

The most commonly used plasma sputtering processes for production of nanoparticles however generally suffer from a low production yield of nanoparticles. The reason is that the pick-up probability of atoms on the surface of previously formed particles or on particle nuclei is low. Therefore, the nanoparticles have a relatively slow growth rate, thus leading to low production rate of nanoparticles of an intended size. Another unwanted effect of the low pick-up probability is low efficiency in the sense that a large fraction of the sputtered atoms can be lost from the production process, for example by escaping to the walls of the sputter chamber or by escaping with the process gas, as opposed to being available for the formation of nanoparticles.

Another important aspect regarding production yield is the possibility of upscaling from a laboratory scale to a production scale. In contrast to some previously known processes for production of nanowires, the present process provides such a possibility. For example, experimental results have shown that the process may be conducted using a hollow cathode as target with a circular aperture of 5 mm in diameter. This approach is straightforward to scale to higher production yield in three ways: (1) to an array of hollow cathodes with the same diameter, (2) to a hollow cathode with a larger aperture diameter, or (3) to a linear hollow cathode. The latter geometry is particularly suitable for industrial production, through roll-on deposition.

According to the present process, at least a portion of the sputtered target atoms are ionised by the plasma. The purpose of allowing the sputtered target atoms to be ionised by the plasma is to increase the probability of the sputtered target atoms to collide with a previously formed nanoparticle or nanoparticle nucleus inside the plasma which thereby enable a higher possibility for growing nanoparticles, and thereby a higher nanoparticle-producing efficiency. This higher probability of collision is a consequence of the negative charge a nanoparticle acquires in a plasma, which for typical plasma conditions (specifically, an electron temperature $T_e$ of a few eV) increases the collection probability of ions with typically two orders of magnitude as compared to the collection of neutrals (see for example Pilch et al., *Size-Controlled Growth of Nanoparticles in a Highly Ionized Pulsed Plasma*, Applied Physics Letters 102, 033108, 2013).

The present process furthermore comprises growth of magnetic nanoparticles from the sputtered target atoms, a portion of the sputtered target atoms being ionised. The growth of the nanoparticles is performed at a distance from the substrate on which the nanoparticles are to be collected. Preferably, the growth of the nanoparticles is performed inside the plasma. The nanoparticles should grow to a sufficient size such that they will have a sufficient magnetic field. The magnetic field of a single domain nanoparticle increases approximately proportional to the cube of the size, and it is magnetized below the Curie temperature of the nanoparticles.

The nanoparticles are in the present process in general grown to an average size of at least 5 nm. Preferably, the nanoparticles are grown to an average size of at least about 10 nm, most preferably to an average size of equal to or more than 20 nm. The nanoparticles will in general acquire a substantially spherical form, but can also have other geometrical forms depending on the process parameters. In the present disclosure, the size of a nanoparticle should be considered to mean the equivalent diameter of the nanoparticle as if the nanoparticle would be spherical.

One example of a process which may be used for the steps of sputtering target atoms, ionising the sputtered target atoms and growing nanoparticles from said sputtered target atoms in accordance with the present invention is disclosed in EP 2,539,480. EP 2,539,480 discloses a plasma sputtering process for producing particles by growth inside the plasma. In said process, the energy provided to the plasma is sufficient to ionise at least a portion of the sputtered target atoms which in turn results in a pick-up flux of ionised sputtered target atoms on the surface of already formed nanoparticles or nuclei of such nanoparticles. The plasma generating apparatus is operated by a pulsed electric power supply. However, in contrast to the process as disclosed in EP 2,539,480 the nanoparticles produced according to the present invention are not collected as separate nanoparticles, but as nanowires as will described in more detail below.

In accordance with the present invention, the resulting nanowires are composed of magnetic material(s). In sputtering, the target needs to be of an electrically conducting material. The target can be produced in accordance with any previously known method for manufacturing a solid target and will therefore not be further described in the present disclosure. However, it is a pre-requisite that the target comprises at least one magnetic metal. Cobolt (Co), Iron (Fe) and Nickel (Ni) are magnetic metals, and can thus be used as target materials in accordance with the present invention. Furthermore, alloys comprising at least one of the aforementioned metals can be used as target material, such as a Co, Fe or Ni alloy alloyed with at least one other non-magnetic element. Furthermore, an alloy comprising or consisting of at least two of Co, Fe and Ni can advantageously be used as target material. The only pre-requisite is that the target material should have sufficient electrical conductivity to allow plasma sputtering. The person skilled in the art is well aware of such an electrical conductivity whereby this is not further discussed herein.

The present invention also provides the possibility of, when desired, supplying materials or elements from a gas to react with the sputtered target atoms so as to form a ferromagnetic compound. One example thereof is the supply of oxygen from a gas (preferably $O_2$) introduced into the apparatus wherein sputtering is performed, preferably during the sputtering, to react with sputtered iron atoms so as to form nanoparticles of $Fe_3O_4$.

In accordance with the present process, the magnetic nanoparticles are collected on a substrate in the form of nanowires which will be described in more detail below. The substrate is located in the controlled atmosphere inter alia to ensure that the nanowires attain the intended chemical composition.

The collection of the magnetic nanoparticles so as to form nanowires relies on the general principle of the ability of magnets to stick together. Since magnets prefer to stick south pole to north pole, nanowires will start to self-assemble in accordance with the present process. This is explained in more detail in the following. Moreover, it has been found that the present process may in some cases produce nanowires which are only one nanoparticle in diameter and wherein the centre of each nanoparticle substantially coincides with the longitudinal centre axis of the nanowire, as will be demonstrated in the experimental results given below.

In accordance with a first aspect of the present invention, the process is used for the production of metallic magnetic nanowires. In such a case, the magnetic nanoparticles are collected before they are given a chance to oxidise to such a degree that it significantly reduces the mechanical strength and/or the electrical conductivity of the assembled nanowires. Thus, the process comprises collecting the produced nanoparticles on the substrate in the controlled atmosphere. The magnetic nanoparticles should have a sufficient electrical conductivity (conductivity higher than $10^3$ $(Ohm\ cm)^{-1}$, preferably higher than $10^4$ $(Ohm\ cm)^{-1}$). Thereby, there will be essentially no oxide present between the nanoparticles comprised in the nanowire, resulting in a pure metallic contact between the nanoparticles. In this case, the process is conducted in such an environment that there is no oxygen available for oxidation of the metallic nanoparticles. The metallic magnetic nanoparticles are preferably collected in or in the vicinity of the plasma.

In accordance with a second aspect of the present invention, the process is used for the production of compound magnetic nanowires, in particular metal oxide magnetic nanowires. In such a case, nanoparticles are grown out of sputtered target atoms as well as elements from a reactive gas introduced into the sputtering apparatus, for example pure oxygen gas. The sputtered target atoms react with the reactive gas before or during growth of the nanoparticles such that the nanoparticles attain the intended chemical composition before collection on the substrate. In contrast to a process wherein the nanowires are produced by forming a metallic nanowire by any previously known process followed by oxidation thereof, the present process may provide a more homogenous structure for the reason that the nanoparticles already have the intended composition when they are collected. Therefore, the present process may provide nanowires of better quality and offer higher production rate since no separate oxidation step needs to be performed.

The present process provides an effective process for production of nanowires of magnetic material. For example, in comparison to Seung H. Huh et al using laser ablation as described above, the production rate of the nanowires can be increased so that the production time is reduced from the order of hours to the order of a few minutes and considerably longer nanowires can be achieved. Moreover, in one embodiment of the present process the nanowires are built up of nanoparticles with a narrow spread in the size distribution that are mainly aligned in individual chains. In another embodiment of the present process the nanowires are built up by nanoparticles with a wide spread in the size distribution. In this latter case the nanowires can branch, and also make connections to close-lying nanowires. This enables the growth of new types of structures of interconnected nanowires with desirable mechanical and electrical properties as will be described below.

The process for producing nanowires according to the present invention has the advantage of providing a high mechanical bonding strength between the nanoparticles forming the nanowires. This is a result of contact between individual nanoparticles which is essentially free from impurities or unwanted compounds; for example in the case of metallic magnetic nanoparticles surface oxides in the contact between adjacent nanoparticles or in the case of metal oxide magnetic nanowires other forms of oxide compositions which would reduce the magnetism of the nanoparticle.

As previously disclosed, the magnetic nanoparticles are produced by sputtering a target, i.e. a cathode, made of a magnetic material by means of a plasma to thereby obtain sputtered target atoms. At least a portion of the sputtered target atoms are ionised in the plasma to increase the probability of a collision of the sputtered target atoms with a previously formed nanoparticle or a nanoparticle nucleus, whereby the nanoparticles are grown to the intended size. The collision of the sputtered target atoms with a previously formed nanoparticle or a nucleus thereof is preferably performed inside the plasma volume of the sputtering apparatus.

FIG. 1 schematically illustrate an apparatus 1 in which the process according to the present invention can be performed. In the figure, the other walls of the apparatus have been omitted. The apparatus 1 comprises a target, in the figure illustrated as a hollow cathode 2, from which the atoms, out of which the nanoparticles (at least partially) are to be formed, are to be sputtered. As shown in the figure, the hollow cathode may be attached to a support plate 5. Furthermore, the cathode may suitably be mounted in a block (not specifically shown) to provide electrical connection and cooling, preferably water cooling. The apparatus further comprises an anode, illustrated in the figure as an anode ring 3. The anode is supported by a support structure 6 suitably suspended from the support plate 5. In order to contain the plasma and/or the nanoparticles, the apparatus preferably comprises a mesh 4, which may also be attached to the support plate 5. The mesh can preferably be a cylindrical mesh.

When the apparatus 1 is used in accordance with previously known techniques for deposition of thin films, the sputtered matter from the target is collected on a substrate 7 arranged at position A in the figure, in the bottom of the apparatus 1 and outside of the mesh 4. In contrast, in accordance with the present invention, the collection is preferably made within the volume defined by the mesh 4. FIG. 1 illustrates two possible locations for the substrate, position B and position C, of the process according to the present invention. Position B may for example be obtained by a substrate attached to the support structure 6 of the anode or by a substrate mounted on a separate holder. Position C represents a position of a substrate next to the anode towards the side, wherein the substrate is not connected to the anode support structure 6 or the anode ring 3. In this case, the substrate may for example be attached to the mesh. It is naturally also possible to obtain the position C by a substrate provided on a separate holder if desired. Position C may suitably be slightly below the anode ring. FIG. 1 shows a substrate 8 arranged at position C.

Process gas, in general an inert gas such as argon (Ar), may suitably be introduced into and flown through the hollow cathode as illustrated by arrow 10. Furthermore, if desiring to also use a reactive gas, such as $O_2$, this can be introduced via a separate inlet 9 as illustrated by arrow 11. The inlet 9 may suitably open up at a distance below the anode 3 such that it is not introduced directly into the plasma during operation.

In order to provide sufficient electrical discharge without risking an electrical break-through and/or unduly overheating the cathode, the plasma is preferably provided using a pulsed power supply. Thereby, it is also easy to enable ionizing a sufficiently large portion of the sputtered target atoms by the plasma generated in the apparatus.

The apparatus 1 also provides a possibility for applying an electrical bias to the substrate 8 when desired as shown in FIG. 1. Applying a bias to a substrate, $U_{BIAS}$, is as such previously known and will therefore not be explained in more detail in the present disclosure.

In the case of desiring to apply a magnetic field for the collection of nanoparticles on the substrate 8, a magnet 12 can be arranged on the side of the substrate opposite the surface of the substrate intended for collection of the magnetic nanoparticles.

When the apparatus 1 as shown in FIG. 1 is used for the present process, magnetic nanoparticles are formed in a growth zone outside the hollow cathode. The growth of the nanoparticles however conducted at a distance from the substrate, i.e. before the nanoparticles are collected on the substrate. The desired fast growth by ion collection occurs preferentially in a region with high electron temperature.

In the following, the relevant theoretical studies that underlie the present invention will be described in more detail.

Magnetic nanoparticles have a tendency to self-organise so as to form nanowires. This effect has previously been described by for example Nedyalkov et al for agglomeration in the gas phase of nanoparticles produced by laser ablation in air. New magnetic nanoparticles are primarily added to the ends of already formed nanowires, or to other locations where the magnetic field is leaking out from an existing nanowire.

Furthermore, the use of a hollow cathode pulsed plasma to give a high degree of ionization of the growth material, and thereby a fast growth of nanoparticles is described in EP 2,539,480. Furthermore, as an example Pilch et al, *Fast growth of nanoparticles in a hollow cathode plasma through orbit motion limited (OML) ion collection*, Applied Physics Letters 103, 193108, 2013, report a growth rate of 470 nm/s as compared to a growth rate of less than 3 nm/s in the case of nanoparticle growth by neutrals.

Besides this high growth rate it is earlier demonstrated that narrow size distributions can be obtained by this pulsed power technique, with half maximum size spreads of typically ±10% to ±20%, and that the average size can be controlled in the range 10-250 nm by six separate control parameters: (1) the discharge geometry (Pilch et al., *Fast growth of nanoparticles in a hollow cathode plasma through orbit motion limited (OML) ion collection*, Applied Physics Letters 103, 193108, 2013) (2) the pulse current, (3) the pulse width (4) the pulse frequency (Pilch et al., *Size-Controlled Growth of Nanoparticles in a Highly Ionized Pulsed Plasma*, Applied Physics Letters 102, 033108, 2013) (5) the gas pressure, and (6) the gas flow (Gunnarsson et al., *The influence of pressure and gas flow on size and morphology of titanium oxide nanoparticles synthesized by hollow cathode sputtering*, Journal of Applied Physics, Volume 120, 044308, 2016)

Moreover, nanoparticles that are grown in a plasma environment are charged negative, with the result that undesired agglomeration in the gas phase is suppressed by the electrostatic repulsion between them.

Figure 2:
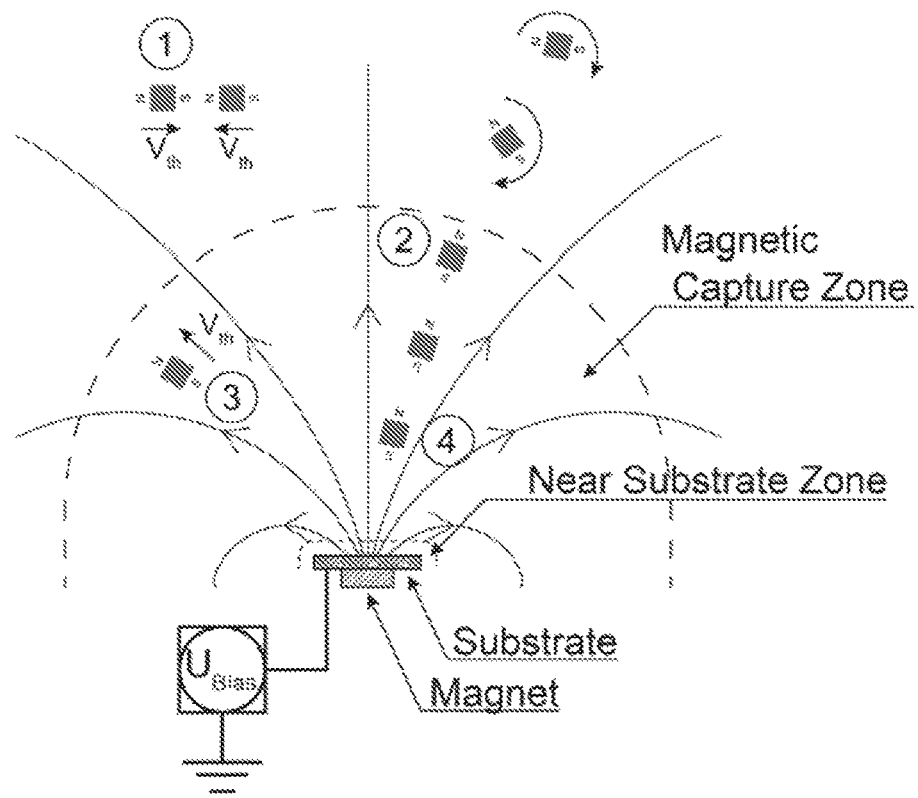

In accordance with the present invention, a plasma sputtering process wherein at least a portion of the sputtered target atoms are ionised in the plasma is used for the growth of nanoparticles. It is a pre-requisite of the present process that magnetic nanoparticles are produced, and therefore the target is made of a magnetic material. The magnetic properties of the resulting magnetic nanoparticles are used both for attracting them towards the substrate and for controlling the structures they form there. One characterising feature in the present invention is that the nanoparticles are grown in a plasma, as opposed to growth in a liquid or in a gas. Another characterising feature is that the nanoparticles form nanowires when they are collected on a substrate, as opposed to forming nanowires in a liquid or forming nanowires suspended in a gas/plasma phase. These characterising features add new features to the previously known techniques discussed above, as will be explained with reference to FIG. 2. FIG. 2 constitutes a schematic illustration of magnetic capture of magnetised nanoparticles to the substrate. The details of the capture process are numbered in circles in the figure.

First of all, there will be a suppression of magnetic nanoparticle agglomeration in the gas/plasma phase. This process is numbered by an encircled number "1" in FIG. 2, and counteracts the wire formation in the gas phase that is described by Nedualkov et al above. If the attraction (north pole to south pole) between magnetized nanoparticles is stronger than their electrostatic repulsion due to their negative charge in a plasma, then there is a risk of undesired agglomeration in the gas/plasma phase. To establish a limit for this to happen, the force between two charged nanoparticles with perfectly aligned magnetic moments can be calculated. The electrostatic repulsion is found to dominate at large distances and the magnetic attraction at shorter distances, giving an energy barrier for two approaching nanoparticles that is exemplified in FIG. 3 (*a*). Eq. (1) gives an analytical expression for this energy barrier $W_{max}$ (given in Joule), wherein $\varepsilon_0$ is the vacuum permittivity, $\emptyset_{NP1}$ is the potential of the first conducting spherical nanoparticle, $\emptyset_{NP2}$ is the potential of the second conducting spherical nanoparticle, $\mu_0$ is the vacuum permeability, $M_1$ is the magnetization of the first particle, and $M_2$ is the magnetization of the second particle.

$$W_{max} = 8\pi \frac{(\varepsilon_0 \emptyset_{NP1} \emptyset_{NP2})^{3/2}}{\sqrt{6\mu_0 M_1 M_2}} \qquad \text{(Eq. 1)}$$

It should be noted that the height of the barrier is independent of the sizes of the nanoparticles when their potentials are fixed. Their separation between their centers $z_{max}$ at the barrier is given by Eq. 2, wherein $r_1$ and $r_2$ are the radii of the two nanoparticles.

$$z_{max} = \sqrt{\frac{2\mu_0}{27\varepsilon_0}} \times \frac{M_1 M_2 r_1^2 r_2^2}{\varepsilon_0 \emptyset_{NP1} \emptyset_{NP2}} \qquad \text{(Eq. 2)}$$

Assuming that the two nanoparticles have the same potential $\emptyset_{NP}$ and the same magnetization M, the energy barrier in units eV is given by Eq. 3.

$$W_{max} = 1.5 \times 10^6 \frac{|\emptyset_{NP}^3|}{M} \quad \text{(Eq. 3)}$$

In a plasma, particles will normally acquire the so-called floating potential, at which the net current to a particle is zero. By way of example, an Ar plasma which may be used in accordance with the present invention, the floating potential $\emptyset_{float} \approx -2.4\ T_e$, where $T_e$ is the electron temperature in units eV. With this nanoparticle potential, the barrier against agglomeration of nanoparticles in the volume is given by Eq. 4.

$$W_{max} = 1.5 \times 10^6 \frac{(2.4 T_e)^3}{M} = 2.1 \times 10^7 \frac{T_e^3}{M} \quad \text{(Eq. 4)}$$

The height of this barrier shall be compared to the typical kinetic energy $$W_{therm} = \left(\frac{3}{2}\right) k_B T_g$$

for nanoparticles that have their thermal kinetic energy $W_{therm}$ (i.e., the energy in translational motion) given by thermal balance with a surrounding process gas at a temperature $T_g$. The agglomeration in the gas/plasma phase should be strongly suppressed below a critical electron temperature $T_e^x$, at which $W_{therm} = W_{max}$. Above this electron temperature, the average thermal energy is insufficient for passing the energy barrier even if two colliding nanoparticles are aligned for maximum magnetic attraction, and are on a direct head-on collisions course. It should be noted that this condition overestimates the probability for agglomeration, since head-on collisions combined with magnetic alignment is an unlikely geometry in random collisions between nanoparticles that that both rotate and have random velocities.

Even for fully magnetized (single magnetic domain) Fe nanoparticles, agglomeration in the gas/plasma phase is found to be strongly suppressed, provided only that the electron temperature is above ~0.15 eV. (For reference, it can be noted that the electron temperature in the active part of the plasma discharge may usually be a few eV.) This condition is, surprisingly, found to be independent of the sizes of the two nanoparticles involved. If dimers cannot be formed in the gas/plasma phase, then the road to the formation of longer nanowires in the plasma is also closed.

The conclusions above are independent of the size of the two nanoparticles, as a long as they are charged negative to the floating potential. In a pulsed high density plasma, such charging occurs for all nanoparticles in the size range of above 10 nm. For smaller nanoparticles, electron field emission can sometimes reduce the negative charge (the size for this to happen depends on the plasma density and the electron temperature). However, also with reduced charge the nanoparticles can be estimated to have sufficient negative charge to avoid agglomeration down to a few nm size. This effect is illustrated by and encircled number 1 in FIG. 2.

In summary, provided that nanoparticles are situated in a plasma where $T_e > 0.15$ eV all the time from their formation until they are collected on a substrate, agglomeration is very strongly suppressed in the gas/plasma phase in accordance with the present invention. This has the result that nanoparticles will arrive individually at the substrate, as opposed to as already-formed nanowires of various sizes. The desirable suppression of agglomeration in a plasma is retained also when the nanoparticles are magnetic.

Secondly, there will be an efficient magnetic capture of nanoparticles from the gas/plasma phase. This process is represented by the encircled numbers "2" and "3" in FIG. 2.

For this part, the electric and magnetic forces that can be used to steer the motion of nanoparticles should be considered. The electric force $F_E$ given by $F_E = Q_{NP} E$, where $Q_{NP}$ is the charge on the nanoparticle and E is the electrical field, and the magnetic force $F_B$ which, for the case where the magnetic moment m of the nanoparticles is aligned with the magnetic field B, is given by $F_B = m\nabla B$ where m=|m| denotes the strength of the magnetic moment, and $\nabla B$ denotes the gradient of the strength B=|B| of the magnetic field.

Besides separating electric and magnetic forces, it is needed to distinguish between long-range forces and short-range forces. The short range forces is considered to be the forces that act close to the substrate, in the device shown in FIG. 1 and used in the experiments below typically less than 1 mm from the substrate. The short-range magnetic force is that experience by a nanoparticle that approaches a substrate where nanowires have earlier begun to assembly. At the end of an existing nanowire in which the nanoparticles have approximately the same size, an approaching nanoparticle will experience an attractive force that will make it attach primarily to the free end on the nanowire where the magnetic flux that is trapped within the nanowire escapes. The extent of such a capture zone increases with the width and the length of the nanowire, but is typically much less than one mm. In the case where a nanowire is built up of nanoparticles of very unequal sizes there can also be such attracting positions along the wire (i.e., not only at the ends), at locations where the magnetic flux is not fully confined inside the wire.

The short-range electric force arises if there is a potential difference between the substrate and the near plasma. Such potential differences arise spontaneously at all boundaries of a plasma in the form of wall sheaths, but can also be imposed on purpose by applying a potential to an electrically conducting substrate. The short-range electric force is, for a substrate placed in a plasma, limited to a sheath of the order of 1-10 Debye lengths, typically much less than a mm. It can be either attractive or repelling, depending on the sign of the applied potential. The electric field in sheaths is herein denoted $E_{SH}$.

The long-range forces are herein considered to be those outside the range of the short-range forces. In an apparatus as disclosed in FIG. 1 this is typically more than a millimetre from the substrate. One important electric long-range force is directed against the direction in which the discharge current flows in the plasma volume where a discharge electric field is maintained during the pulses with the strength needed to make the discharge current flow through the plasma. This field is directed so as to draw electrons to the anode. The spatial extent of this electric force is the whole volume through which the discharge current flows. In the present disclosure, this is called the discharge electric field and denoted by $E_D$. During the pulses $E_D$ is directed away from the anode, and therefore attracts the negatively charged nanoparticles towards it. A second long range electric field that can influence the motion of charged nanoparticles is that associated with ambipolar diffusion, here denoted $E_{AD}$. This plays a role mainly between the pulses when $E_D$ is zero. The plasma density left after the pulse is higher in the centre of the device. This gives a situation where the ambipolar field has an outwards directed radial component which is needed to keep back the electrons from escaping the dense central plasma. The ambipolar electric field therefore also is directed so as to keep the negatively charged NPs confined to the centre. The strength of this confinement depends twofold on the electron temperature between the pulses: both the charge on the nanoparticles and the strength of the ambipolar field $E_{AD}$ are proportional to $T_e$. A strong dependence on pulse frequency of this confinement effect is therefore expected. In summary, the effect of the long range electric forces is generally to draw the nanoparticles towards the anode (the discharge field during the pulses) and towards the central axis of the device (the ambipolar field between the pulses). The net effect is to tend to keep nanoparticles in the growth zone longer than if they just would follow the gas flow.

The long range magnetic force arises when a magnet is used, for example placed behind the substrate as shown in FIG. 1. In contrast to an externally applied electric field, the magnetic field penetrates without hindrance into the plasma and there acts upon the magnetized nanoparticles. The plasma volume can in this regard be separated into two regions with respect to the magnetic capture. Within a capture zone, defined by an energy condition to be given below, the nanoparticles align their magnetic moment m with the magnetic field B, and the magnetic force $F_B$ is directed towards the substrate placed in front of the magnet. Outside the capture zone, the magnetic force has only minor effect on the motion of the nanoparticles. This process of magnetic capture is denoted by the encircled numbers "2" (alignment of the magnetic moment) and "3" (attraction to the magnet) in FIG. 2.

The extent of the capture zone follows from an energy argument as follows. A nanoparticle with a magnetic moment m in a magnetic field B has a magnetic potential energy $\emptyset_B$ given by Eq. 5.

$$\emptyset_B = -m \cdot B \tag{Eq. 5}$$

If m and B are parallel this is a negative energy, and the nanoparticle is then in a potential well. The magnetic moment of a single domain magnetized NP is approximately given by Eq. 6.

$$m = M V_{np} \tag{Eq. 6}$$

M is the magnetization of the material in the nanoparticle and $V_{np}$ is its volume. A comparison can be made between the potential of Eq. (5) to the thermal energy $$W_{th} = \frac{3 k_B T_g}{2}$$

in the three degrees of freedom of translational motion of a nanoparticle which is in thermal equilibrium with the process gas at a temperature $T_g$. Such a particle can just marginally escape the magnetic potential trap when $\emptyset_B = W_{th}$, which gives the critical magnetic field strength for capture according to Eq. 7.

$$B_{crit} = \frac{3 k_B T_g}{2 M V_{np}}. \tag{Eq. 7}$$

The required alignment of m and B for this relation to hold is automatically upheld inside the capture zone. The reason is that the average thermal energy associated with rotation is identical to the translational energy $W_{th}$ that was used to derive the critical magnetic field strength above. Inside the capture zone the energy needed to rotate a nanoparticle from having m parallel to B to antiparallel is then, from Eq. 5, more than twice $W_{th}$. Nanoparticles that are inside the capture zone are therefore confined to wiggle around the direction of alignment between m and B. Due to this alignment of the two vectors in Eq. 5, the force (the gradient of the potential $\emptyset_B$) becomes simplified as given in Eq. 8.

$$F_B = \mu \nabla B. \tag{Eq. 8}$$

It should be noted that $F_B$ always is directed towards the strongest magnetic field, independent of the direction of the magnetic field. A local magnet thus attracts nanoparticles from all directions, also across the magnetic field lines.

In summary, FIG. 2 shows an overview of the mechanisms that govern the magnetic collection of magnetized nanoparticles. There are three zones where different forces dominate on the nanoparticles: a near substrate zone, a magnetic capture zone, and a zone where the magnetic forces are unimportant.

Thirdly, there will be a magnetic control of impact direction, and velocity, of nanoparticles onto the substrate. This process is represented by the encircled number "4" in FIG. 2. From the force equation, Eq. 8, follows that the magnetic force in the capture zone is always in the direction of the gradient of the magnetic field strength. Their impact direction onto the substrate can therefore be controlled by controlling the magnetic field structure in the volume outside the substrate. Their kinetic energy is to the first approximation (neglecting, e.g., the frictional drag between a moving nanoparticle and the neutral gas), given by the loss in potential energy from infinity according to Eq. (5). This loss is proportional the local magnetic field strength, and to the nanoparticles' magnetic moment $m = M V_{NP}$, were M is the magnetization and $V_{NP}$ is the volume of the nanoparticle. Since both the magnetic moment and the nanoparticle mass are proportional to the cube of the linear size, the nanoparticles' impact velocities on the substrate are therefore independent of their size, and proportional to the square root of the magnetic field strength at the impact point.

Figure 3A:
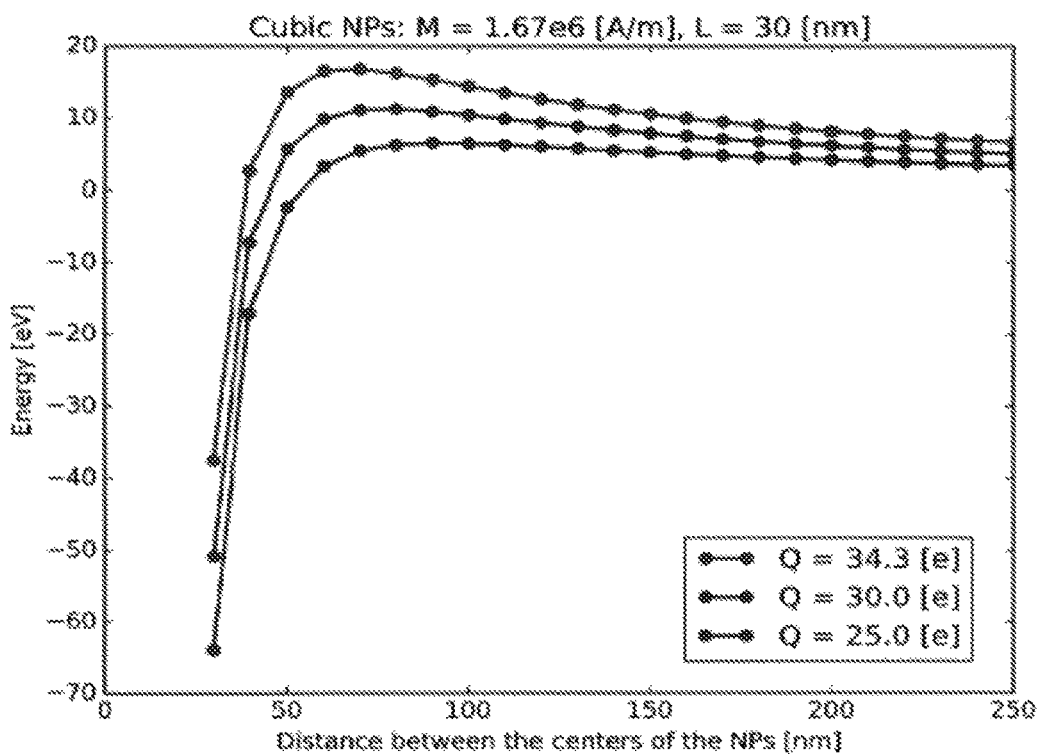
FIG. 3 illustrates theoretical results regarding the collection of nanoparticles from the growth zone, wherein (a) represents exact calculations of the energy barrier that prevents agglomeration of nanoparticles in the plasma, for cubic Fe nanoparticles with a 30 nm side, and aligned for maximum magnetic attraction. The three curves are in the same top-down order as in the inlaid box which gives the charges. Panel (b) shows limits to the capture zone for a 0.36 T magnet.
Figure 3B:
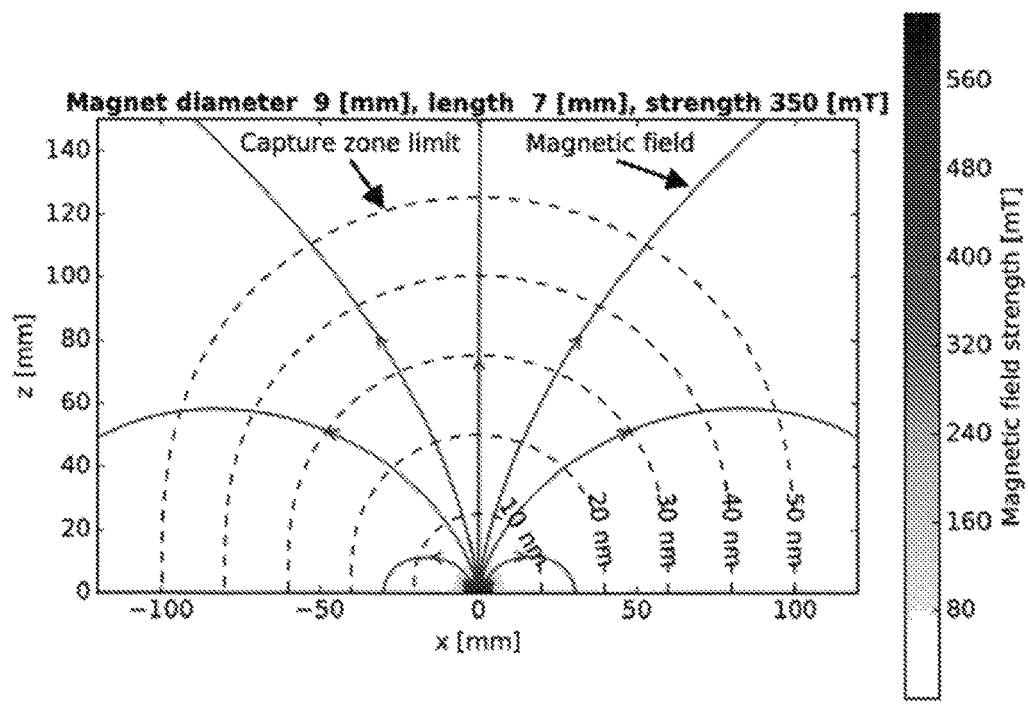

FIG. 3 illustrates theoretical results regarding the collection of nanoparticles from the growth zone. In FIG. 3(a), exact calculations of the energy barrier that prevents agglomeration of nanoparticles in the plasma, for cubic Fe nanoparticles with a 30 nm side, and aligned for maximum magnetic attraction. The charge of the topmost curve corresponds to a voltage of $-3$ V. For separations larger than the position of the maximum this result is in good agreement with approximate result of the potential assuming spherical nanoparticles, and thus confirms the barrier height of Eq. (2). In FIG. 3(b), limits to the capture zone for a 0.36 T magnet used in most of the experiments presented below, for Fe single domain magnetised nanoparticle in the size range from 10 nm to 50 nm, is shown. These capture zones cover most of the zone of fast nanoparticles growth in the apparatus as illustrated in FIG. 1. The magnetic field is first calculated for the magnet in question, and the capture zone limit is then obtained from Eq. (7).

From the above it is clear that the present process provides an effective process for production of nanowires of magnetic material. For example, in comparison to Seung H. Huh et al using laser ablation as described above, the production rate of the nanowires can be increase from the order of hours to the order of a few minutes and considerably longer nanowires can be achieved. Moreover, there will be a high bonding strength between the nanoparticles of the nanowire resulting in nanowires of high quality. Additionally, in view of the fact that the contact between the nanoparticles of the nanowires can be essentially free from unwanted impurities or compounds, the nanowires will have superior properties as regards to electrical conductivity as well as magnetic properties. Moreover, in the nanowires obtained by the present process, it is possible to obtain a result wherein the nanoparticles are strongly aligned in the meaning of the centre of each nanoparticle in the nanowire coinciding with the longitudinal centre axis of the nanowire if this is desired. This result has not previously seen for example in metallic nanowires obtained by laser ablation in which the nanoparticles are arranged such that their respective centres may be offset from the longitudinal centre axis of the nanowire.

Moreover, the magnetic properties of the nanoparticles can be further utilised by using an applied magnetic field using an external magnet to get the nanoparticles to assemble in predetermined patterns. The applied magnetic field will ensure that the nanowires are grown in the direction of the magnetic field, thereby for example enabling a plurality of linear and parallel nanowires extending from the substrate on which the nanoparticles are collected. Furthermore, structures can be tailored by purposively positioning of the magnet, used for applying the magnetic field, in relation to the substrate.

In accordance with one particular embodiment of the present invention, nanowires comprising different magnetic materials may be achieved along the longitudinal extension of the nanowire. The nanowires can be highly tailored to obtain the desired properties thereof. In fact, they can be controlled to comprise only a few nanoparticles of a first metallic material followed by a few nanoparticles of a second metallic material, the first and second metallic materials alternating along the longitudinal direction of the nanowire. A nanowire comprising two different magnetic materials along the longitudinal extension of the nanowire may for example be achieved by using two different targets, one of the first magnetic material and another of the second magnetic material, and sputter from one of the targets first and then sputter from the other target. Naturally, more than two different magnetic materials may also be used for the same purpose.

A process for production of magnetic nanowires comprising a first longitudinal portion composed of magnetic nanoparticles of a first magnetic material and a second longitudinal portion composed of nanoparticles of a second magnetic material may for example comprise the following steps:

a. sputtering atoms from a first electrically conducting target made of a first magnetic material, wherein sputtering is performed in a controlled atmosphere using a plasma;
b. ionising at least a portion of the sputtered target atoms of the first magnetic material in said plasma;
c. using the sputtered target atoms from the first magnetic material (of which at least a portion thereof are ionised) to grow a first set of magnetic nanoparticles comprising the sputtered target atoms of the first magnetic material, wherein the growth of the first set of magnetic nanoparticles is conducted at a distance from a substrate on which the magnetic nanoparticles are to be collected;
d. in the controlled atmosphere, collecting the first set of magnetic nanoparticles on the substrate in the form of a plurality of first pile-ups of nanoparticles, each of said pile-ups corresponding to a first longitudinal portion of a magnetic nanowire; followed by
e. sputtering atoms from a second electrically conducting target made of a second magnetic material, wherein sputtering is performed in the controlled atmosphere using the plasma;
f. ionising at least a portion of the sputtered target atoms of the second magnetic material in said plasma;
g. using the sputtered target atoms from the second target material (of which at least a portion thereof are ionised) to grow a second set of magnetic nanoparticles comprising the sputtered target atoms from the second magnetic material, wherein the growth of the second set of magnetic nanoparticles is conducted at a distance from the substrate on which the magnetic nanoparticles are to be collected; and
h. in the controlled atmosphere, collecting the second set of nanoparticles on the plurality first pile-ups of nanoparticles, so as to form the second longitudinal portion of the nanowires on the first longitudinal portion of the nanowires.

Optionally, steps a-d can be repeated after step h, thereby forming nanowires having a longitudinal portion of the second magnetic material between two longitudinal portions of the first magnetic material. Furthermore, the steps a-h may be repeated multiple times whereby nanowires with alternating magnetic materials in the longitudinal direction may be achieved.

The nanowires obtained by the present invention can be used in various technical fields. In particular, they are highly suitable in energy storage devices, for examples as electrodes. They may also be efficiently used in electrodes for electrocatalysis. The nanowires may also be coated with another material, such as graphene, silicon etc. as known in the art depending on the intended use of the nanowires.

In particular, two technologically important areas for the application of the nanowires include use in batteries and the use in electrocatalysis devices. In view of these applications truss-structures are of great interest. First it is their mechanical strength due to the "cross-linking" of the nanowires. Secondly, the cross-linking, together with the "pure" conducting interfaces between the individual nanoparticles, ensure excellent electric connectivity to the substrate of the nanowires. Another interesting application is to use the nanowires as electron field-emission based cathodes.

The nanowires obtained by the present process may also suitably be used in other applications, including but not limited to magnetic storage devices, microwave absorbing materials, gas sensors, spintronic devices, catalysts and biomedical applications.

EXPERIMENTAL TESTS

All of the experimental tests disclosed below were performed in an apparatus as schematically illustrated in FIG. 1. The apparatus comprises a cathode (i.e. a target), in the form of a hollow cathode. The nanoparticles were produced in a high vacuum system, with a base pressure in the $10^{-7}$ Torr ($10^{-5}$ Pa) range. The cathode was a Fe hollow cathode with an inner diameter of 5 mm, a length of 54 mm and a purity of at least 99.95%. The cathode was mounted in a copper block to provide electrical connection and water cooling. A cylindrical mesh was placed from the exit of the cathode as shown in FIG. 1. The mesh had a diameter of 88 mm and a length of 110 mm, and was kept at floating potential throughout the experiments. Around 20 mm from the exit of the cathode, a grounded anode was placed. The anode was in the form of a ring with a diameter of 35 mm and made of stainless steel. As sputter gas, Ar was used. It was let in through the hollow cathode, at a flow of 70 sccm. A second gas, $O_2$, was let in through the chamber wall, about 30 cm away from the cathode exit. The gas was diluted with 95 mol % Ar, and the flow was set to 0.5 sccm, giving an effective flow of 0.025 sccm of $O_2$.

A High-Power Impulse Magnetron Sputtering (HiPIMS) device from Ionautics was used. The pulse frequency was kept at 1200 Hz and the pulse width at 80 μs throughout the experiments. The output power was also kept constant, at 60-70 W.

On the inside of the mesh, at position C shown in FIG. 1, permanent magnets of different magnetic strength were placed in some of the experimental tests. Two types of permanent magnets were used in the experiments. One type has a diameter of 9 mm, a height of 7 mm and a magnetic field strength at the centre of the surface facing the plasma of 0.36 T. The other type was a Neodymium disc magnet, with diameter 15 mm, height 2 mm and a magnetic field strength at the centre of the surface facing the plasma of 1.3-1.4 T.

In other experimental tests, the collection of nanoparticles was performed on a substrate located at position B shown in FIG. 1. In these cases, a polymer tape was used as substrate.

Silicon substrates were attached to the magnets by the use of double-sided copper tape while for substrates of Fe foils no such tape was needed, due to the magnetic features of the Fe itself. All substrates arranged at position C were quadratic with 10 mm side. No shutter was used between the cathode and substrate during the process, which means that the substrate was exposed to nanoparticle "collection" from the moment the power supply was turned on.

Experimental Test 1

A direct measure of the efficiency of the overall process is the amount of mass that is collected on the substrate in the form of nanowires. Collection on the substrate is the last step in a chain of events which is analysed in the theory given above.

The efficiency of the whole production chain of events, beginning with the sputtering of a mass $m_{sputt}$ inside the hollow cathode, and ending with a final mass $m_{subst}$ being collected in the form of nanoparticles on the substrate, can be written as a sequence of efficiency factors f representing the individual steps in the process, as given in Eq. 9.

$$m_{subs} = m_{sputt} f_{ext} f_{np} f_{subst}$$ (Eq. 9)

The total sputtered mass $m_{sputt}$ inside the hollow cathode during a pulse can be obtained from the current and voltage profiles during a pulse as follows. The discharge current at the cathode surface is carried partly by ions going to the surface, partly by secondary electrons that are emitted from the surface upon ion impact. For metal surfaces the secondary emission yield is low, typically in the range from 0.05 to 0.2 depending on the material. For an approximate estimate, the electron current is here neglected and the ion current to the cathode is approximated to be equal to the discharge current. The time-integrated current is converted to a number of ions by division with the electron charge e, assuming mainly singly charged ions. Each ion that hits the cathode sputters out atoms with a probability given by the sputter yield $Y_{sputt}$. These yields are known quantities, in the present case about 0.3. The sputtered mass is thus obtained as $$m_{sput} = \frac{\langle I_{D,pulse}\rangle t_{pulse} f_{pulse}}{e} m_{Fe} t_{exp} Y_{sputt}$$

where $m_{Fe}$ is the atomic mass of Fe, and the pulse variables will be defined below Eq. (10). The factor $f_{ext}$ in Eq. (9) accounts for the extracted fraction of this sputtered material. The two remaining factors in Eq. (9) are the fraction $f_{np}$ of the extracted material that forms nanoparticles, and the fraction $f_{subst}$ of these nanoparticles that are collected on the substrate. These two last factors $f_{np}$ and $f_{subst}$ are herein called the nanoparticle-formation efficiency and the substrate-collection efficiency, respectively. They are very difficult to estimate theoretically. In the present invention there is, however, often such a large collection of nanoparticles on a substrate that the deposition can be detached as a unit and weighted separately. This opens the possibility of an empirical determination of the product $f_{np}f_{subst}$. The extracted mass is estimated in Eq. 10 as the product of the two first factors to the right in Eq. 9.

$$m_{extr} = m_{sput} f_{ext} = \frac{\langle I_{D,pulse}\rangle t_{pulse} f_{pulse}}{e} m_{Fe} t_{exp} Y_{sputt} f_{ext}$$ (10)

where the average current in the pulse is $\langle I_{D,pulse}\rangle$, the pulse length is $t_{pulse}$, the pulse frequency is $f_{pulse}$, and the experimental time duration is $t_{exp}$.

A quantitative analysis of a special case, where 2 mg of nanoparticles were collected on a substrate during 10 minutes of operation, is used to show that the technique can be optimized so that both $f_{np}$ and $f_{subst}$ are of the order of unity. Thus, a very efficient process can be achieved by the present process, in which a large fraction of the growth material is used for the formation of nanoparticles, and also a large fraction of these nanoparticles are collected on the substrate.

In the special case above, the substrate-collection efficiency $f_{subst}$~1 was obtained without using a magnet, by collecting on a substrate (polymer tape) that was placed on the holder to the anode, at position B in FIG. 1. The reason for an efficient collection of nanoparticles at this location is proposed to be that the discharge electric field in the growth zone during the pulses is directed so as to drag negatively charged nanoparticles towards the anode. During the pulses, the discharge electric field ($E_D$) estimated to be of the order of several 100 V/m. This is strong enough to dominate as compared to other forces on the nanoparticles such as gravity, and neutral gas flow drag.

Figure 4:
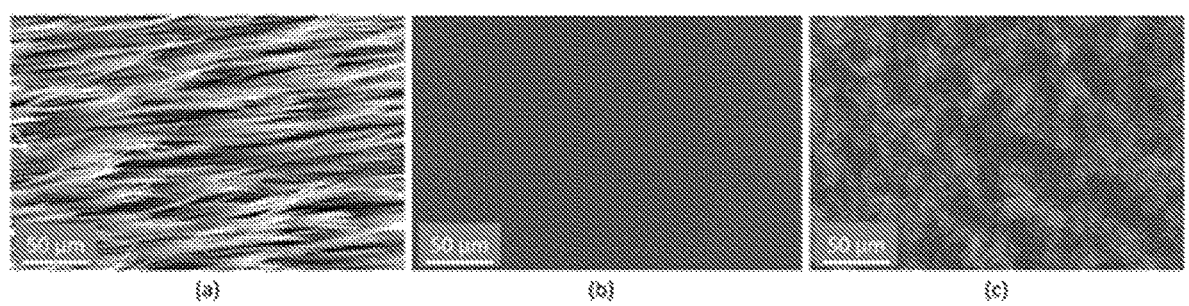
FIG. 4 Illustrates Scanning Electron Microscope (SEM) images for three different experimental tests, wherein (a) represents pulsed operation and magnetic collection, (b) represents direct current operation and magnetic collection, and (c) represents pulsed operation without magnetic collection.

Also magnetic capture can give collection efficiencies of the same order, with the advantage that here the substrate needs not be placed so close to the anode. FIG. 4 demonstrates separately the effects of efficient nanoparticle growth by ion collect, and efficient collection using a magnet. The three images (a)-(c) in the figure show substrates with the same magnification, all being placed at the position C shown in FIG. 1, and with the discharges run at the same power and during the same length of time.

More specifically, FIG. 4 constitutes Scanning Electron Microscope (SEM) images that demonstrate that the combination of nanoparticle growth by ion collection (here obtained by pulsed operation) and effective collection of nanoparticles to the substrate (here using magnetic collection) are necessary to give the high efficiency of the present invention. Image (a) shows a substrate where both are used (pulsed operation and magnetic collection). In image (b) the high ionisation of sputtered target atoms is removed (by DC-operation of the apparatus, and with magnetic collection). In image (c), the growth by ion collection is removed (pulsed operation, without magnetic collection). FIG. 4(a) shows normal operation conditions where a high $f_{np}$, is the result of a high degree of ionization of the sputtered atoms (obtained by pulsing the power source), and a high $f_{subst}$ is obtained by using a magnet behind the substrate that has a capture zone (as shown in FIG. 3 b) that for a typical nanoparticle size of 30 nm extends 6-7 cm, all the way across the device. In this case the substrate is covered with a dense "grass" built up of nanowires, and extending more than 100 µm from the substrate. For comparison, FIG. 4(b) shows the effect of reducing the degree of ionization by operating in dc instead of pulsing, while still using the magnetic collection process. Close inspection with higher magnification (not shown here) reveals that far less than a monolayer of nanoparticles is collected, and they are so isolated that they have not yet begun to form nanowires. FIG. 4(c) shows the opposite combination: a high degree of ionization (pulsed operation), but a substrate without a magnet (in order to avoid variations in the geometry, the magnet was here replaced with a piece of plastic that had the same form). In this case, there is more collection than in FIG. 4(b), and nanowires have begun to grow and form the tangles that are typical for collection without a magnet. However, the substrate is visible between, and sometimes through, these tangles. The deposition here is obviously higher than the one seen in FIG. 4 (b), but still far lower than the one in FIG. 4 (a).

Experimental Test 2

Figure 5:
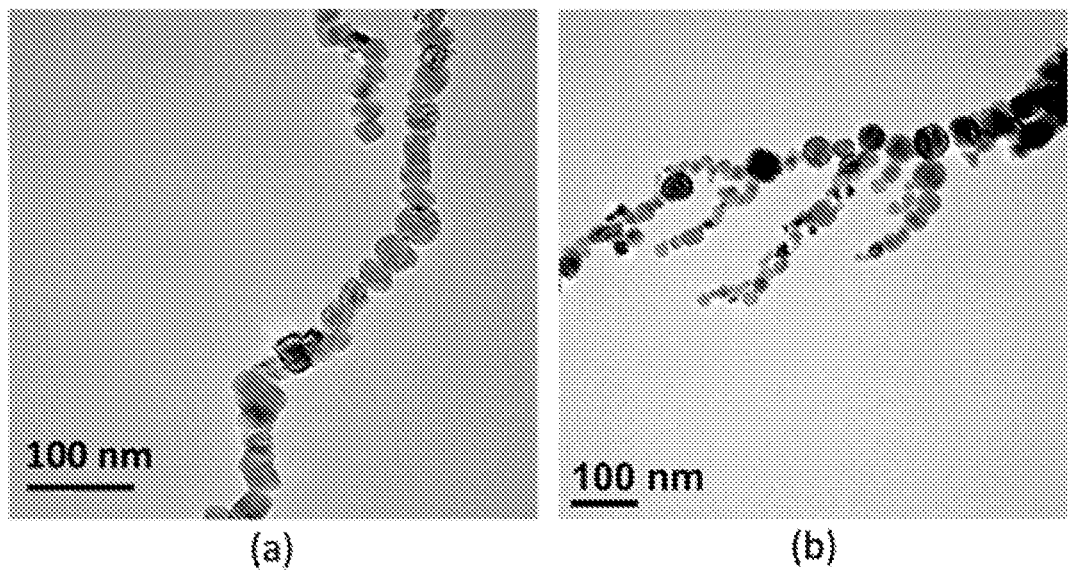
FIG. 5 illustrates Transmission Electron Microscope (TEM) images wherein (a) represents typical nanowires built up of nanoparticles with a small spread in average size, here being collected without the use of a magnet, and (b) represents typical nanowires built up of nanoparticles with a large spread in size, here being collected using a magnet

FIG. 5 constitutes Transmission Electron Microscope (TEM) images wherein (a) represents typical nanowires built up of nanoparticles with a small spread in average size, here being collected without the use of a magnet, and (b) represents typical nanowires built up of nanoparticles with a large spread in size, here being collected using a magnet. The images demonstrate the fact that when a magnetic material is used in the sputtering process, the depositions on the substrates are built up of nanowires. In comparison, this would not be the case with the substrate located in the previously disclosed position A in FIG. 1 as conventionally used for film deposition.

When a magnetic material is used in the sputtering process, the depositions found on the substrates at position B and C in FIG. 1 are with only one exception (the extremely low deposition in FIG. 4 (b)) built up of nanowires, as opposed to e.g. close packed bulk material or cauliflower-like structures that are typical for depositions of non-magnetic nanoparticles on substrates. These nanowires are basically of two types. FIG. 5 (a) shows a typical structure when the nanoparticles have a relatively small size spread. This results in individual chains that are generally very long, up to several µm, and without branching. FIG. 5(b) shows a typical structure where the nanoparticles have a large size spread. This gives nanowires that branch and split up as shown here, but which can also connect to the sides of nearby nanowires and form truss structures as will be discussed below. Such branching and connection is usually seen at locations along the nanowires where nanoparticles of different size meet, and is physically understood as due to the magnetic field that leaks out from the larger nanoparticles at such locations. This allows, for example, two smaller nanoparticles to become attracted to sit side by side on one larger nanoparticle and thereby start a branching of the original nanowire.

Experimental Test 3

Figure 6:
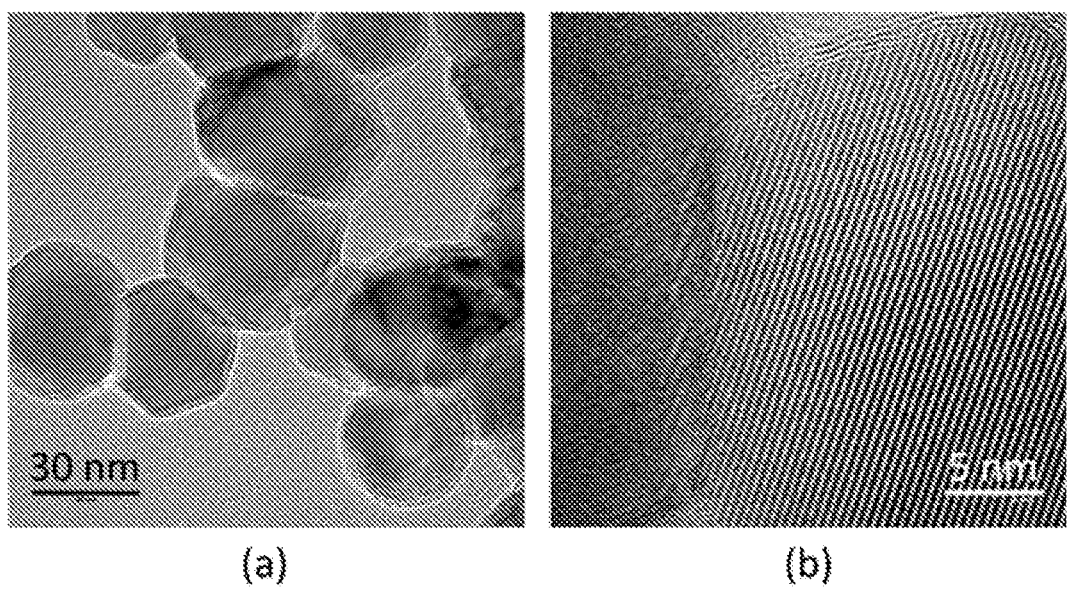
FIG. 6 illustrates Transmission Electron Microscope (TEM) images showing the joints between nanoparticles wherein (a) shows that no oxide layers are seen at the joints when these are seen perpendicular to the axis between their centres, and (b) shows a close up of the interface, i.e. the contact, between nanoparticles in a nanowire obtained in accordance with the present invention.

FIG. 6 illustrates Transmission Electron Microscope (TEM) images of nanowires and demonstrates that high quality joints between the individual nanoparticles in the nanowires can be achieved with the present process. The key lies in controlling the atmosphere. To achieve both a high productivity and high quality joints, the atmosphere must contain the right density of a species that stimulates nucleation. With too little such a gas, nucleation forms a bottleneck in the formation of nanoparticles, giving low productivity and low efficiency in use of the available sputtered growth material. Depending on the cleanness of the vacuum system (the absence of water and other contaminants), the addition of low concentrations of $O_2$ sometimes becomes necessary for nucleation. In all experiments reported here a standard addition of $O_2$ is let in through the chamber wall, below the cathode exit, with an effective flow around 0.04% of the Ar flow. This gives enough nucleation for a high productivity as reported in experimental test 1. FIG. 6 also demonstrates that the degree of oxidation is negligible, giving both pure Fe cores of the nanoparticles and oxidation free joints between them. The FIG. 6(a) also shows oxide layers, typically a few nm thick, that are formed after exposure of the nanowires to air, thus maintaining oxide free joints between the nanoparticles.

Experimental Test 4

Different types of structures can be formed on the substrate by different discharge operation and substrate collection methods. In the present experiments (except in the dc operation case shown in FIG. 4(b)) all discharge parameters are kept the same: the pulse amplitude, the pulse length, the pulse frequency, the discharge geometry, the gas flow, the gas pressure, and the additional flow of $O_2$ to stimulate nucleation. This leaves a large field of possibilities unexplored. We here limit the ambition to show some special cases of structures that can be collected on the substrates by varying the substrate location, the use of a magnet for the collection, and the deposition time.

Figure 7:
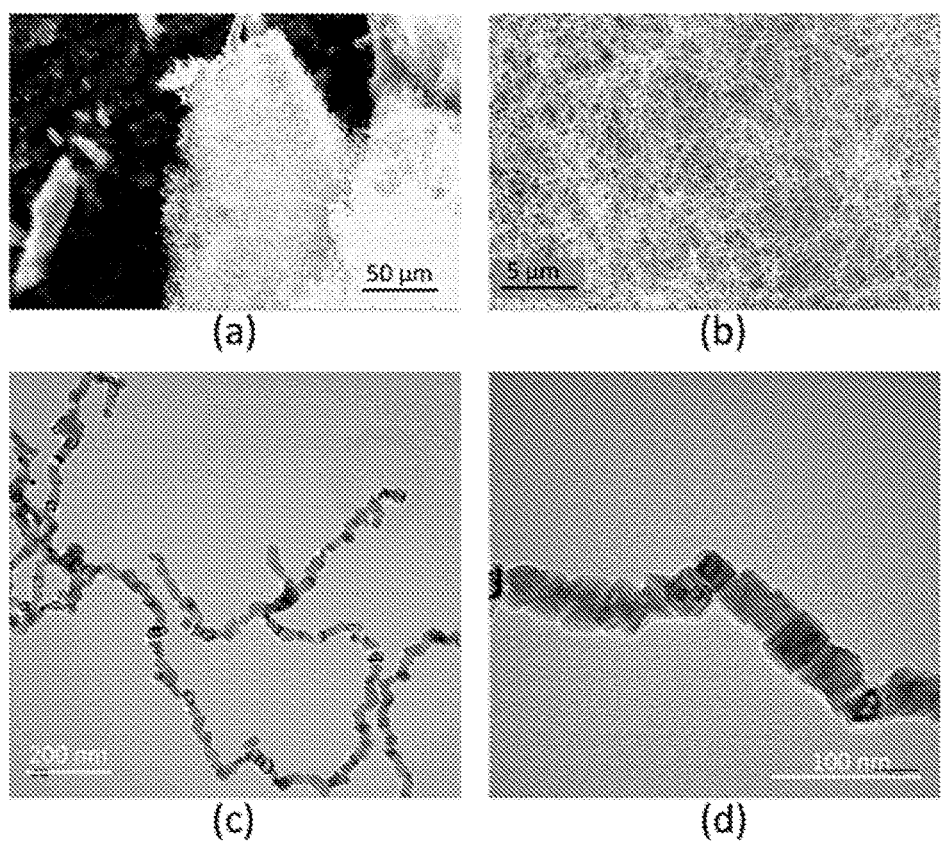
FIG. 7 illustrates a typical nanowire structure collected without the use of a magnet, wherein (a) is a SEM image of a piece of tangle of nanowires, (b) is a close-up SEM image showing the nanowires in the tangle, (c) is a TEM image of nanowires of such a tangle, separated by sonication, and (d) a side view TEM image of a nanowire.

FIG. 7 shows a typical nanowire structure collected without the use of a magnet. FIG. 7(a) constitutes a SEM image of a piece of a tangle collected on a polymer tape (constituting the substrate) at position B in FIG. 1. FIG. 7(b) is a close-up SEM image showing that the nanowires in the tangle are randomly distributed. FIG. 7(c) is a TEM image of nanowires from such a tangle, separated by sonification. It was found that the these nanowires contain about 100 nanoparticles and form strings without branching. FIG. 7(d) shows a side view TEM image of a nanowire from the tangle. It can be seen that the nanowire has oxide-free joints between the nanoparticles, and a 3-5 nm thick surface oxide layer which is formed after exposure to air.

The first example is nanowire structures taken from collection without the use of a magnet. These then have a characteristic structure which we herein call a tangle. One example of a tangle from a substrate with low deposition was shown above in FIG. 4 (c), collected at position C in FIG. 1, but without the use of a magnet. A high deposition tangle, collected at the position B in FIG. 1, is shown in FIG. 7 (a). From the volume to weight ratio, the density of tangles formed at this location is estimated to be of the order of 0.2% of bulk Fe. FIG. 7(b) illustrates the characterizing feature of tangles, that the nanowires are randomly oriented. Besides being built up or randomly oriented nanowires, the collected tangles have two additional characteristic features. First, a typical single nanowire from a tangle, see FIG. 7(c), typically consist of nanoparticles with a rather narrow size distribution, and these nanoparticles are arranged as a single "string of pearls" with little or no branching and reconnecting. Second, it is possible to separate single nanowires in a tangle from the other nanowires by sonication, i.e. applying sound energy to agitate particles in a sonic bath. This shows that the nanoparticles in the nanowires in a tangle are much stronger bound to each other, along the nanowires, than the separate nanowires are bound to each other in the tangle.

Figure 8:
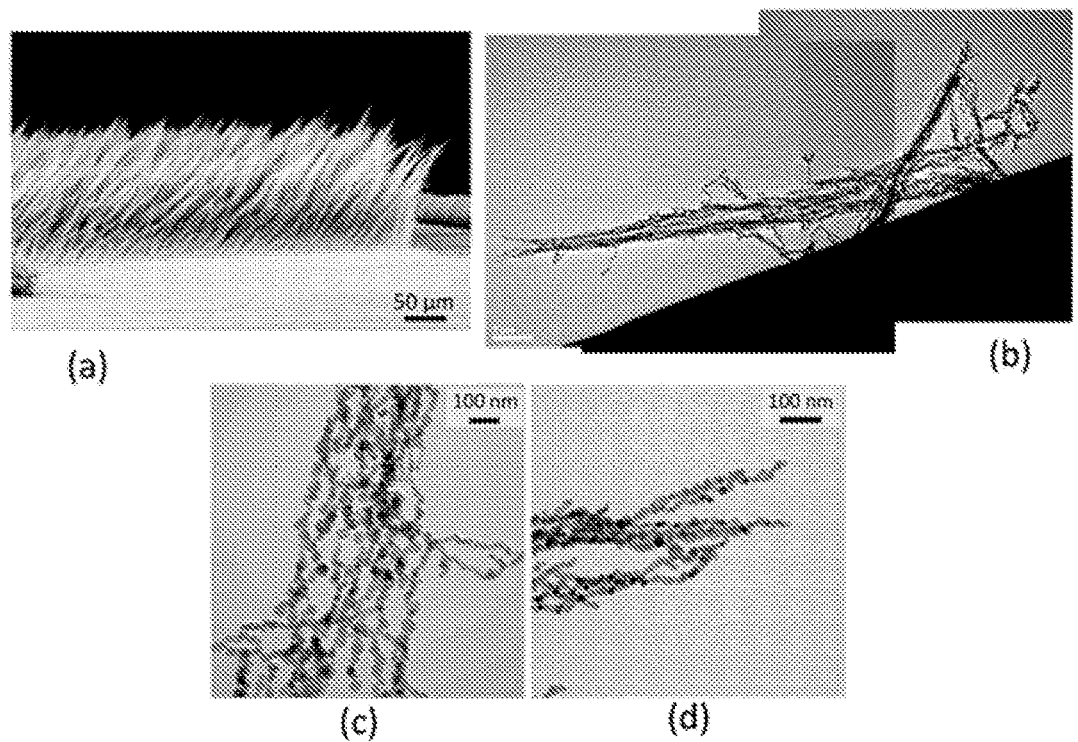
FIG. 8 illustrates a typical nanowire structure collected with the use of a magnet, wherein (a) is a SEM image of Truss Structured Bundles of Nanowires (TSBN), (b) is a TEM image of one separated TSBN, (c) is a TEM image of the middle of the TSBN according to (b), and (d) is a TEM image of the tip of the TSBN according to (b).

The next example is of nanowire structures obtained by collection using a magnet, which will be explained with reference to FIG. 8 which illustrates a typical nanowire structure collected with the use of a magnet.

These nanowire structures have several characteristic features that distinguish them from the tangles that are grown without a magnet. The most striking feature, obvious already to the naked eye, is that the material formed on the substrates shows structures that are in alignment with the externally applied magnetic field direction. We will here focus on one type of such structure, which is exemplified in FIG. 8(a). FIG. 8(a) is a SEM image. In low magnification it looks as a dense field of grass. The grass has a length of "straws" of 150-200 μm, and a typical width in the middle of a "straw" of ~1 μm. A top view of a similar structure was seen in FIG. 4(a). These grass structures have self-organized during the nanowire growth process, and are much more mechanically robust than the tangles collected without a magnet. The individual nanowires in a "straw of grass" is difficult to separate by sonication, while the "straws" of grass can be separated from each other and then keep their identity as separate units. The reason for this mechanical strength is apparent on larger magnification. FIGS. 8(b) to (d) show close-ups with increasing magnification. The "stem" of the "grass" is seen to be built up of cross-linked nanowires, with only very few open nanowire ends. We propose to call these entities, the "straws of grass", Truss Structured Bundles of Nanowires, or TSBNs. In engineering, a truss is a structure that "consists of two-force members only, where the members are organized so that the assemblage as a whole behaves as a single object". Trusses have very high strength for a given amount of building material used.

One likely physical reason for the spontaneous growth of these truss structures is that they contain nanoparticles with a large size dispersion, as was exemplified in FIG. 5 (b). This is in contrast to earlier obtained more narrow size dispersions of typically ±10% to ±20% from this type of hollow cathode pulsed discharges. One probable explanation to this large size dispersion is the magnetic collection process. Inside the growth zone there must at all times be a mix of nanoparticles at various stages in the growth process, i.e., of various size. Combining FIG. 1 and FIG. 3 (b) shows that the zone of fast nanoparticle growth is mostly covered by the capture zone of the magnet, which however depends on the size of the nanoparticles. For example, 30 nm nanoparticles are collected from a distance of about 60 mm which covers the whole growth zone, while 15 nm nanoparticles are collected from about 30 mm, or half the growth zone. The large size dispersion might be because the magnetic collection does not let all the nanoparticles grow to their final size, but instead drags some of them out earlier. This would give a broader size distribution on the substrate. A discussed above, a large size dispersion gives a possibility of branching and re-connection of the individual nanowires on the substrate. This is proposed to be the basic reason for the truss structures.

FIG. 8(b) constitutes a TEM image of one TSBN separated from the others by sonification and shows that it is strong enough to keep its form. FIG. 8(c) constitutes a TEM image of the middle of this TSBN, showing the cross-linking of the nanowires which form the truss structure. FIG. 8(d) constitutes a TEM image from the tip of this TSBN and shows that there are nanowires with free ends. On these the TSBN can collect new nanoparticles, and thereby grow.

Experimental Test 5

Figure 9:
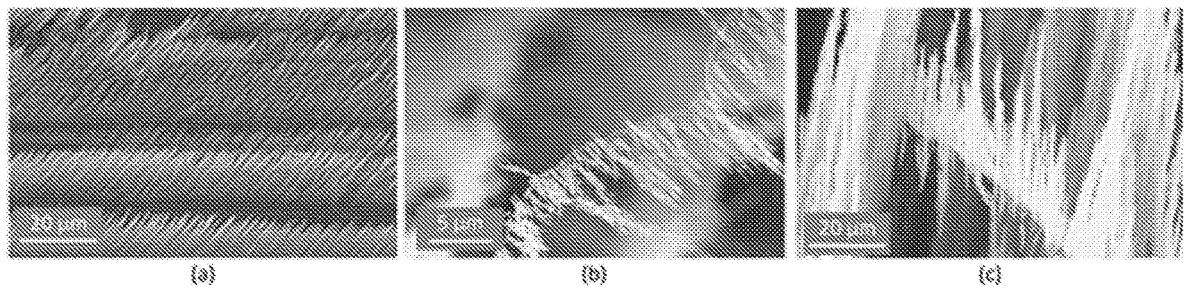
FIG. 9 illustrates SEM images demonstrating that the patterns of nanowire growth, under an applied magnetic field, reflect the patterns of their initiation sites.

FIG. 9 constitute SEM images and demonstrates that the nanowire growth patterns can be controlled by structures on the substrate, structures down to the scale of a single nanowire. FIG. 9(a) shows TSBNs grown on substrates of rolled Fe sheets, and collected using a magnet. The horizontal rows follow the direction of rolling of the Fe sheet, and probably are initiated by ridges from the rolling process. The growth in these rows is directed along the direction of the magnetic field, and is identified as the truss structured nanowires, TSN, of the type discussed above. In FIG. 9(b) the growth has begun on a "fallen" single nanowire oriented across the direction of the magnetic field. It is not known why the "fallen" single nanowire was oriented at a large angle to the magnetic field. However, it is clear that it serves as a seed for further growth, now along the magnetic field. FIG. 9(c) shows a similar situation, where the growth has begun to self-organize to form TSBNs. The images in FIG. 9 together show that the locations of growth can be initiated by substrate structures down to the nanoscale, and then keep the memory of that initial structure in the further growth.

Experimental Test 6

Figure 10:
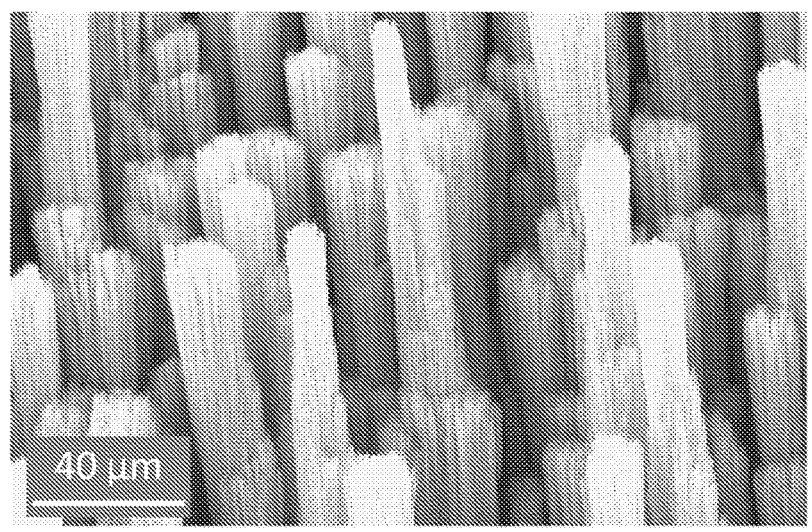
FIG. 10 illustrates a SEM image of spontaneous grouping of closely packed TSBNs.

FIG. 10 shows one of the most enigmatic structures found during the experiments. One possibility is that this structure is initiated by similar patterns on the cathode, but it is rather believed that some unknown process during the growth from the substrate have made this the favorable mode of growth. Whatever the reason, FIG. 10 serves to demonstrate that a wide variety of nanowire structures is possible to grow.

From the experimental results given above, the following can be noted. The TSBNs with a diameter of ~1 μm seem to be natural, self-organized, building blocks in the collections on the substrates when an external magnet is used. FIG. 8 (a) shows them in the form of dense grassland, FIG. 9 shows how they can grow in linear arrays from a cathode on which there are microscale linear ridges from the manufacturing process, and FIG. 10 shows them grouped together in bundles of typically 10 μm diameter. It should however be noted that these images, however, are obtained under one single combination of discharge parameters, and with Fe nanoparticles with approximately 30 nm average size. Variations in nanoparticle size and material, other substrate surface patterns, other magnetic field structures and strengths, and/or other electric substrate biases can be used to further tailor the nanowires, TSBNs, and other nanowire configurations for different purposes.

Moreover, it should be noted that while the experimental results given herein merely relates to a production of metallic iron nanowires, similar results may be expected for other magnetic metals and magnetic compounds. Magnetic materials differ from each other with respect to the domain size and their residual magnetization $M_{RES}$. The domain size ranges from ~10 nm to 1 mm depending on the material (Bishop et al). Single domain magnetic nanoparticles can therefore exist with larger sizes for some materials than for Fe as studied here. The nanoparticle size does not, however, influence the effect of suppression of agglomeration in the gas phase. The reason is that the potential barrier, as given in Eqs. 1 and 4, is independent of the nanoparticle size. Regarding the variations in residual magnetization $M_{RES}$ between materials, both the tendency to form nanowires and the process of magnetic collection from a capture zone qualitatively holds for all magnetic materials, although the effects quantitatively depend on $M_{RES}$ of the material; for example, the size of the capture zone increases with increasing $M_{RES}$ as given in Eq. 7. In summary, similar results as those demonstrated here for Fe (suppression of nanoparticle agglomeration in the gas phase, magnetic collection of nanoparticles to a substrate, and a tendency of the nanoparticles to form nanowires there) are expected also for other magnetic metals and magnetic compounds.

The invention claimed is:

1. A process for production of magnetic nanowires, the process comprising:
   a. sputtering atoms from a first electrically conducting target made of a first magnetic material, wherein sputtering is performed in a controlled atmosphere using a plasma;
   b. ionising at least a portion of the sputtered target atoms in said plasma;
   c. using the sputtered target atoms of which at least a portion thereof are ionised to grow magnetic nanoparticles comprising the sputtered target atoms, wherein the growth of the nanoparticles is conducted at a distance from a substrate on which the magnetic nanoparticles are to be collected, the substrate being located in a volume wherein the electron temperature $T_e$ is equal to or higher than 0.1 eV; and
   d. in the controlled atmosphere, collecting the magnetic nanoparticles on the substrate in the form of a plurality of nanowires by addition of the magnetic nanoparticles onto nanowires, or nuclei thereof, already present on the substrate, by means of magnetic attraction from said nanowires, or nuclei thereof, already present on the substrate;
   wherein the plasma is generated by a pulsed electric power supply.

2. The process according to claim 1, wherein the growth of the magnetic nanoparticles is performed inside the plasma.

3. The process according to claim 1, wherein the first magnetic material is a first magnetic metal or an alloy comprising the first magnetic material.

4. The process according to claim 1, wherein the controlled atmosphere is an inert atmosphere.

5. The process according to claim 1, wherein the magnetic nanoparticles are collected on the substrate with the use of an applied magnetic field.

6. The process according to any one of claim 1, wherein the magnetic nanoparticles are collected on the substrate without the use of an applied magnetic field.

7. The process according to claim 1, wherein ionising at least a portion of the sputtered target atoms in said plasma comprises ionising at least 20% of the sputtered target atoms.

8. The process according to claim 1, wherein the substrate is located inside the plasma or at least in a volume wherein the electron temperature $T_e$ is equal to or higher than 0.2 eV.

9. The process according to claim 1, wherein the substrate, at least the surface thereof adapted for collection of the nanoparticles, is electrically conducting.

10. The process according to claim 1, wherein the substrate is provided with an electric bias.

11. The process according to claim 1, wherein the pulsed electric power supply is applied with a frequency of at least 100 Hz, and with a duration of the pulses of at least 5 microseconds.

12. The process according to claim 1, wherein the pulsed electric power supply is obtained with a current density of more than 0.1 A/cm$^2$, as calculated over the whole target surface.

13. The process according to claim 1, further comprising sputtering atoms from a second electrically conducting magnetic target made of a second magnetic material.

14. The process according to claim 1, wherein the growth of magnetic nanoparticles comprising the sputtered target atoms is performed until the magnetic nanoparticles have an average size of at least 10 nm, wherein the size of the nanoparticle is defined as the equivalent diameter of the nanoparticle as if the nanoparticle would be spherical.

15. The process according to claim 1, wherein the magnetic nanoparticles are ferromagnetic with a magnetically single domain.

16. A tangle of randomly oriented individual magnetic nanowires, each magnetic nanowire composed of a first metal or a first compound, and wherein the tangle has a density of less than 5% of a bulk density of the material of which the magnetic nanowires are composed.

17. A magnetic nanowire comprising a plurality of magnetic nanoparticles characterized in that a first longitudinal portion of the magnetic nanowire is composed of magnetic nanoparticles of a first magnetic material and a second longitudinal portion of the magnetic nanowire is composed of magnetic nanoparticles of a second magnetic material.

18. An article comprising (i) the nanowires produced according to the process of claim 1, (ii) a tangle of randomly oriented individual magnetic nanowires, each magnetic nanowire composed of a first metal or a first compound, and wherein the tangle has a density of less than 5% of a bulk density of the material of which the magnetic nanowires are composed, or (iii) a magnetic nanowire comprising a plurality of magnetic nanoparticles characterized in that a first longitudinal portion of the magnetic nanowire is composed of magnetic nanoparticles of a first magnetic material and a second longitudinal portion of the magnetic nanowire is composed of magnetic nanoparticles of a second magnetic material wherein the article is a magnetic storage device, a microwave absorbing material, a gas sensor, a spintronic device, an energy storage device, an electrode material for electrocatalysis, an electrode material for battery applications, a catalysts, or a biomedical application.

19. The magnetic nanowire of claim 17, wherein the magnetic nanowire comprises a plurality of said first longitudinal portion and a plurality of said second longitudinal portion, the first longitudinal portions alternating with the second longitudinal portions along the longitudinal extension of the magnetic nanowire.

* * * * *